United States Patent [19]
Lim et al.

[11] Patent Number: 6,026,108
[45] Date of Patent: Feb. 15, 2000

[54] VERTICAL-CAVITY SURFACE-EMITTING LASER WITH AN INTRACAVITY QUANTUM-WELL OPTICAL ABSORBER

[75] Inventors: Sui F. Lim, Sacramento; Janice A. Hudgings, Oakland; Kam-Yin Lau, Danville; Connie J. Chang-Hasnain, Union City, all of Calif.

[73] Assignee: The Regents of the University of California, Oakland, Calif.

[21] Appl. No.: 09/071,653

[22] Filed: May 1, 1998

Related U.S. Application Data

[63] Continuation-in-part of application No. 08/731,527, Oct. 16, 1996, Pat. No. 5,757,837.

[51] Int. Cl.$^7$ ...................................................... H01S 3/19
[52] U.S. Cl. ................................ 372/50; 372/43; 372/46; 372/28; 372/96
[58] Field of Search .................................. 372/50, 28, 43, 372/44, 45, 46, 96, 92

[56] References Cited

U.S. PATENT DOCUMENTS

| | | | |
|---|---|---|---|
| 4,796,264 | 1/1989 | Suzuki | 372/29 |
| 5,416,790 | 5/1995 | Yodoshi et al. | 372/46 |
| 5,506,170 | 4/1996 | Yodoshi et al. | 437/129 |
| 5,519,362 | 5/1996 | Li et al. | 332/130 |
| 5,574,738 | 11/1996 | Morgan | 372/28 |
| 5,604,628 | 2/1997 | Parker et al. | 359/344 |
| 5,610,096 | 3/1997 | Yodoshi et al. | 437/129 |
| 5,757,837 | 5/1998 | Lim et al. | 372/50 |

OTHER PUBLICATIONS

Anthony et al., "Observations of Negative Resistance Associated with Superlinear Emission Characteristics of (Al, Ga) as Double–Heterostructure Lasers", *IEEE Journal Quantum Electronics*, QE–16(7):735–739 (1980).

Lau et al., "Interaction of a Bistable Injection Laser with an External Optical Cavity", *Applied Physics Letters*, 40(5):369–371 (1982).

Lear et al., "Small and Large Signal Modulation of 850nm Oxide–Confined Vertical–Cavity Surface–Emitting Lasers", Conference on Lasers and Electro–Optics, (Optical Society of America, Washington, DC, 1997), paper CWA2.

Mitsuhashi et al., "Voltage Change Across the Self–Coupled Semiconductor Laser", *IEEE Journal of Quantum Electronics*, 17(&):1216–1225 (1981).

Nugent et al., "Self–Pulsations in Vertical–Cavity Surface–Emitting Lasers", *Electronics Letters*, 31(1):43–44 (1995).

Tang et al., "Observation of Bistability in GaAs Quantum–Well Vertical–Cavity Surface–Emitting Lasers", *IEEE Journal of Quantum Electronics*, 33(6):927–932 (1997).

Zhou et al., "Surface–Emitting Laser–Based Optical Bistable Switching Device", *Appl. Phys. Lett.*, 59(21):2648–2650 (1991).

*Primary Examiner*—Brian Healy
*Attorney, Agent, or Firm*—William S. Galliani; Pennie & Edmonds LLP

[57] ABSTRACT

A laser comprises a first contact to receive an active region control signal, a second contact to receive an optical absorber control signal, and a sandwich of distributed Bragg reflector mirror stacks. Each distributed Bragg reflector mirror stack has an alternate doping with respect to an adjacent distributed Bragg reflector mirror stack. An active region is positioned in the sandwich to provide optical gain in response to the active region control signal. An optical absorber is positioned in the sandwich. The optical absorber has wavelength dependent absorption in response to the optical absorber control signal. The device of the invention may be utilized as an integrated detector, a self-pulsating laser, a high speed intracavity modulator, or an optical pick-up device.

20 Claims, 29 Drawing Sheets

VERTICAL-CAVITY SURFACE-EMITTING LASER WITH AN INTRACAVITY QUANTUM-WELL OPTICAL ABSORBER

This application is a continuation-in-part of the application entitled "Intracavity Quantum Well Photodetector Integrated within a Vertical-Cavity Surface-Emitting Laser", Ser. No. 08/731,527, filed Oct. 16, 1996, now issued as U.S. Pat. No. 5,757,837.

This invention was made with Government support under Grant (Contract) No. N00014-96-1-0583, awarded by the Office of Naval Research. The Government has certain rights to this invention.

BRIEF DESCRIPTION OF THE INVENTION

This invention relates generally to lasers. More particularly, this invention relates to a vertical-cavity surface-emitting laser with a wavelength-dependent intracavity optical absorber, which may be used as an integrated detector, a self-pulsating laser, a high speed intracavity modulator, or an optical pick-up device.

BACKGROUND OF THE INVENTION

Vertical-cavity surface-emitting lasers (VCSELs) are used as light sources in a variety of electronic applications including fiber optic communications, laser printing, and optical data storage. A VCSEL is an injection diode laser where the laser oscillation and output occur normal to a semiconductor pn junction plane. In edge-emitting laser diodes, the laser oscillation and output occur in the semiconductor pn junction plane. VCSELs have many advantages compared with edge-emitting laser diodes. These advantages include a low divergence circular output, single longitudinal mode operation, and high two-dimensional packing density.

All lasers use the principle of amplification of electromagnetic waves by stimulated emission of radiation. The term laser is an acronym for light amplification by stimulated emission of radiation.

The process of stimulated emission can be described as follows. When atoms, ions, or molecules absorb energy, they can emit light spontaneously (as in an incandescent lamp) or they can be stimulated to emit by a light wave. If a collection of atoms is pumped so that more are initially excited than unexcited, then an incident light wave will stimulate more emission than absorption, and there is net amplification of the incident light beam. This is the way a laser amplifier works.

A laser amplifier can be made into a laser oscillator by arranging suitable mirrors on either end of the amplifier to form a resonator. Thus, the essential parts of a laser oscillator are an amplifying medium, a source of pump power, and a resonator. Radiation that is directed straight along the axis bounces back and forth between the mirrors and can remain in the resonator long enough to build up a strong oscillation. Radiation may be coupled by making one mirror partially transparent so that part of the amplified light can emerge through it.

The fundamental light-producing mechanism in an injection diode laser, such as a VCSEL, is the recombination of excess conduction-band electrons and valence-band holes. This recombination operation takes place by pumping excess carriers across a junction. That is, excess electrons are injected from a semiconductor n-layer and excess holes from a semiconductor p-layer into an active waveguide region, where they recombine, via stimulated emission, producing the desired gain. The lasing threshold is reached when optical loss is balanced by optical gain.

Many applications of semiconductor lasers require dynamic stabilization of the light output against variations in the external environment. It is also necessary to monitor long-term drift in the laser and its drive circuitry. In most commercially available diode lasers, this is done by using a discrete external monitoring photodiode chip. The photocurrent generated by the external detector is used in a feedback circuit to adjust the laser injection current.

Recently, it has been proposed to substitute discrete external monitoring photodiode chips with monolithic photodiodes for the use with VCSELs. In these schemes, photodiodes are placed either on the top, on the bottom, on the side, or along the perimeter of the VCSEL. In this location, the photodiode directly intercepts and samples the laser emission as it exits the device.

While the monolithic approach avoids many of the problems associated with the use of a separate monitoring photodiode chip, its performance is far from ideal. The primary problem with these devices is that they detect too much spontaneous emission. In addition, they are susceptible to ambient light. Consequently, the performance of the proposed monolithic photodiodes is inferior to that of a separate monitoring photodiode chip. Thus, it would be highly desirable to develop an improved monolithic photodetector for use in VCSELs.

In addition to the need for improved monolithic photodetectors for use in VCSELs, there is a need for improved modulation of VCSELs at high frequencies. Primary characteristics of interest in VCSEL modulation include high speed, high modulation depth, and low frequency chirp. Depending on the modulation technique and the application involved, any combination of these features may be manifested. For example, an external modulator integrated with a VCSEL eliminates frequency chirping since the modulating element is outside the lasing cavity. However, if the absorption layer is thin (i.e., a single quantum well), then the speed is high but the small single-pass absorption leads to low modulation depth. If the absorption layer is thick, the thickness required for a bulk layer would be very large, requiring large voltages to achieve the same electric field as that across a single quantum well since the interaction length in a vertical cavity is much shorter than that in an in-plane laser. Multiple quantum wells would number in the tens or hundreds—an impractical growth.

Direct current modulation has been demonstrated for high speeds and high modulation depths. However, the changes in carrier density introduce frequency chirp, which may not be suitable for applications where frequency stability is required.

One technique to obtain modulated light output from a VCSEL is to generate self-pulsation in the device. A self-pulsating VCSEL has an AC output derived from a DC input. Known self-pulsating lasers are edge-emitters. It would be highly desirable to develop a self-pulsating VCSEL because the surface-normal geometry would facilitate two-dimensional array configurations and wafer-scale fabrication. In addition, the circular beam output of the VCSEL could be exploited.

Although self-pulsation in VCSELs has been previously analyzed and observed with repetition rates up to the MHz range, no VCSEL has yet been observed to self-pulsate at high frequency or with a controllable saturable absorber. In the prior art, the self-sustained oscillations have been observed by introducing, intentionally or inadvertently, saturable absorbing centers surrounding the device cavity. In view of the foregoing, it would be highly desirable to provide a VCSEL with improved self-pulsation through a wavelength dependent intracavity quantum-well absorber.

Lasers are used in the prior art for optical pick-up detection. However, current optical disk readout schemes use an edge-emitting laser as the optical source and a separate external photodetector. It would be highly desirable to integrate the optical source and detector into a single device. Such an approach would eliminate noise due to reflections from unnecessary bulk optics and also minimize the physical size of the device. It would also be desirable to use an end-emitting laser, the circular beam output of which would allow the the output beam to be focussed to a spot size that is smaller than that of an edge-emitting device. Focusing the beam to a smaller spot size would increase the allowable information density on the optical disk.

In sum, it would be highly desirable to develop an improved VCSEL to overcome the foregoing limitations associated with prior art VCSEL technology.

SUMMARY OF THE INVENTION

A laser comprises a first contact to receive an active region control signal, a second contact to receive an optical absorber control signal, and a sandwich of distributed Bragg reflector mirror stacks. Each distributed Bragg reflector mirror stack has an alternate doping with respect to an adjacent distributed Bragg reflector mirror stack. An active region is positioned in the sandwich to provide optical gain in response to the active region control signal. An optical absorber is positioned in the sandwich. The optical absorber has wavelength dependent absorption.

The laser or VCSEL structure itself has a characteristic transmission wavelength that is deliberately designed. In conjunction with the biasing circuitry used to apply a signal to the absorber, the designable position of this characteristic transmission wavelength (also called Fabry-Perot wavelength) relative to the absorber band-edge determines the function of the device. The Fabry-Perot wavelength and the absorption band edge results in different device functions. The Fabry-Perot wavelength and the absorption band edge can be designed so that the absorber is characterized by a negative differential resistance when its current-voltage trace is measured. Depending on how the absorber is biased (i.e., what sort of load line/external circuitry is applied to the absorber), the device can exhibit (a) bistability and hence be used for optical pick-up detection or (b) self-pulsations. In the optical pick-up configuration, the primary function of the absorber is to (a) detect the signal from external feedback and (b) amplify the response signal through the bistability that results from the carefully designed absorber and VCSEL structure. The optical pick-up configuration provides a low noise, compact alternative to existing bulk edge-emitter and external photodetector readout schemes.

The device of the invention also has a number of benefits over edge-emitting devices of the prior art. These benefits include circular beam output, wafer scale fabrication, and potential two-dimensional array configurations.

BRIEF DESCRIPTION OF THE DRAWINGS

For a better understanding of the nature and objects of the invention, reference should be made to the following detailed description taken in conjunction with the accompanying drawings, in which:

in FIG. 36(a) the device is designed with the Fabry-Perot wavelength shorter than the absorber band-edge; in FIG. 36(b) the device is designed with the Fabry-Perot wavelength longer than the absorber band-edge, resulting in an $I_a$-$V_a$ response exhibiting negative differential resistance.

Like reference numerals refer to corresponding parts throughout the several views of the drawings.

DETAILED DESCRIPTION OF THE INVENTION

Figure 1:
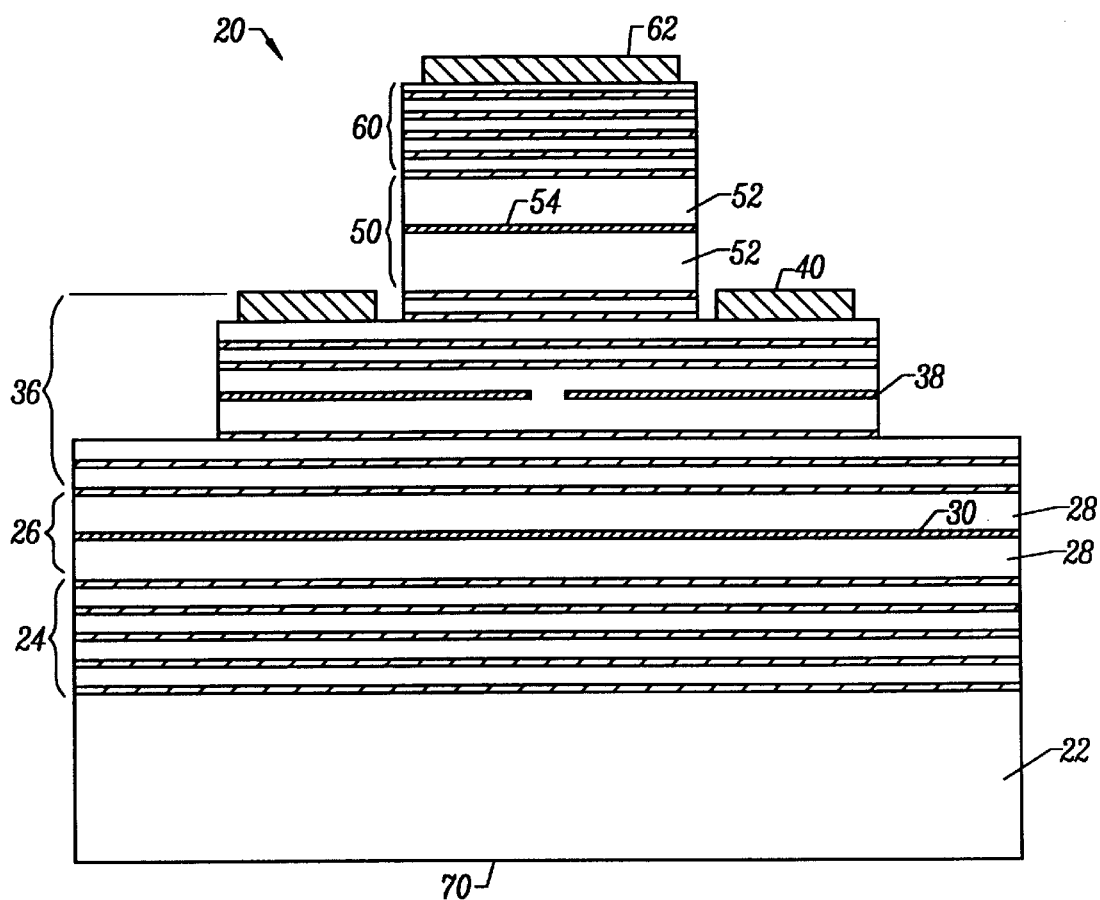
FIG. 1 is a cross-sectional view of an injection diode laser constructed in a with an embodiment of the invention.

FIG. 1 illustrates an intracavity quantum well photodetector integrated within a vertical-cavity surface emitting laser 20 in accordance with an embodiment of the invention. In one embodiment of the invention, the apparatus 20 includes an n+ doped GaAs substrate 22. Grown on the substrate 22 is an n-doped distributed Bragg reflector (DBR) mirror stack 24. DBR mirror stacks are known in the art. In particular, the optimization of such a structure for a particular application is known in the art. An active gain region 26 is constructed on top of the n-doped DBR mirror stack 24. The active gain region 26 includes a one-wavelength spacer 28 with a quantum well stack 30 positioned therein. The quantum well stack 30 includes two 80-Angstrom thick $In_{0.2}Ga_{0.8}As$ quantum wells.

A p-doped DBR mirror stack 36 is positioned on top of the active gain region 26. One or more current confinement layers 38 are formed within the stack 36. The current confinement layer 38 is 3 DBR pairs away from the active region 26. The current confinement layer 38 may be in the form of a 3/4λ-thick AlAs (aluminum arsenide) oxidation layer. An oxidation layer of $Al_xGa_{1-x}As$, where x is approximately one, may also be used. In the alternative, an air gap may be used. The air gap may be formed by etching a sacrificial layer. Thereafter, regrowth may be executed or an air bridge may be constructed. Proton implantation by shadow masking or a similar technique may also be used to form a current confinement layer. An annular contact 40 is formed on the p-doped DBR mirror stack 36.

An intracavity quantum well photodetector 50 is then formed on the p-doped DBR mirror stack 36. The intracavity quantum well photodetector 50 includes a 5λ/4 spacer 52 with one 80-Å $In_{0.2}Ga_{0.8}As$ (indium gallium arsenide) quantum well 54 formed therein as the detector.

An n-doped DBR mirror stack 60 is then grown on top of the intracavity quantum well photodetector 50. An n-contact 62 is deposited on top of the device 20. The p contact 40 is deposited after etching down to the p+ doped layers of the p-doped DBR mirror stack 36. The p-contact 40 is used to forward bias the active region 32, while the n-contact 62 is used to control the voltage across the quantum-well detector 50. Further, contacts 62 and 40 are used to bias the detector. The laser is biased using contact 40 and the substrate 22.

In the embodiment of FIG. 1, light comes out of the bottom surface 70 of the substrate 22. Thus, it is referred to as a bottom-emitting device. The device can also be designed to have light come out of the top surface. A top-emitting device may be constructed with an annular N-contact which allows light to escape through its aperture. A different configuration of DBR pairs is used in a top-emitting device. In sum, FIG. 1 illustrates an embodiment of the invention wherein an n-p-n VCSEL device 20 is defined. In general, the device operates in a manner that is consistent with existing VCSEL devices. That is, excess charge carriers are injected from the n-layer and p-layer regions of the device into the active region 26. The lasing threshold is reached when the optical loss is balanced by the optical gain. In prior art devices, this operation is monitored by a discrete external photodetector or a photodetector constructed on the top or bottom of the VCSEL. However, in accordance with the invention, the device is operated in conjunction with the intracavity quantum well photodetector 50. That is, the intracavity quantum well photodetector 50 of the invention provides an improved photocurrent for use in a standard feedback circuit which is used to adjust the laser injection current in a standard manner. Naturally, the improved photocurrent signal can be used for other purposes as well. Particular benefits of this intracavity quantum well photodetector 50 are discussed below. Attention presently turns to a discussion of processing steps that may be used to construct the device of the invention.

The apparatus of FIG. 1 may be constructed in any number of ways. One advantage of the invention is that its processing steps are consistent and compatible with well known processing steps. The following processing steps may be used in accordance with one embodiment of the invention.

Figure 2:
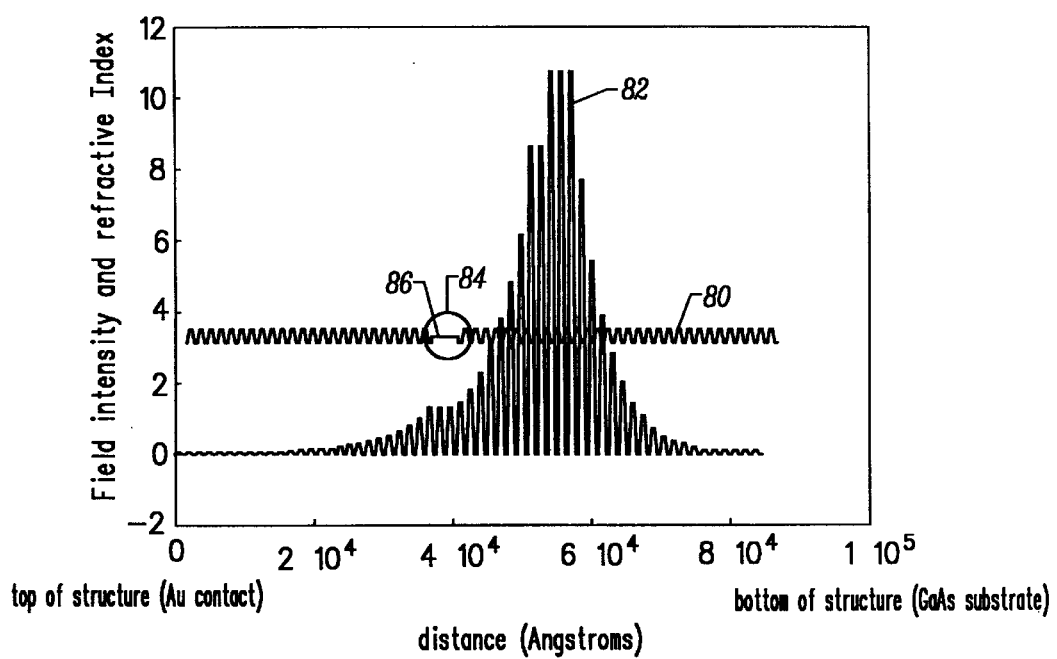
FIG. 2 illustrates the intensity-field distribution within the resonating cavity of a bottom-emitting device in accordance with an embodiment of the invention.

A wafer is grown on a GaAs substrate via molecular beam epitaxy with a refractive index profile as shown in FIG. 2.

Waveform 82 of FIG. 2 illustrates the intensity-field distribution within the resonant cavity defined by the DBR stacks 24 and 36. The peaks of the intensity-field distribution overlap with the quantum wells.

The discontinuity of waveform 80 shown within the circled region 84 corresponds to the spacer of the quantum well detector 50. The peak 86 corresponds to the quantum well 54.

The wafer is then diced into smaller units for ease of processing. A layer of AlAs is then oxidized to provide a current confinement layer. This is done by patterning the sample by standard photolithography to produce 90-micron circles of photoresist. The sample is then etched with a 1:8:40 sulfuric acid:hydrogen peroxide:deionized water solution until the AlAs layer is exposed. The photoresist is then washed off, using acetone followed by methanol. The sample is then placed in an oxidation furnace (flowing water vapor at approximately 425 degrees Celsius) until the desired aperture is achieved. The oxidation time usually needs to be calibrated first. The desired aperture is around 10 microns in diameter.

Next, the n-contact 62 is deposited. This may be done by patterning the sample using standard photolithography to produce approximately 20-micron circles of photoresist centered over the 90-micron etched circles. Evaporation of 150 Angstroms of nickel, 350 Angstroms of germanium, 500 Angstroms of gold, 350 Angstroms of nickel, and finally 1500 Angstroms of gold is then performed. The photoresist is then stripped, using acetone followed by methanol.

The p-contact 40 is then formed. This may be done by patterning the sample using standard photolithography to produce approximately 34-micron diameter circles of centered photoresist. The sample is then etched in 1:8:40 sulfuric acid:hydrogen peroxide:deionized water until the p+ doped layers are reached. The sample is then dipped in 10:1 buffered oxide etch or 1:40 hydrofluoric acid:deionized water to clean off any AlGaAs oxides. The photoresist is then washed off. The sample is then patterned by standard photolithography to produce annular dark-field rings (centered) about 70 microns in diameter and 16 microns in annulus width. Approximately 200 Angstroms of titanium and 2000 Angstroms of gold are then evaporated. Finally, the photoresist is washed off.

Figure 3:
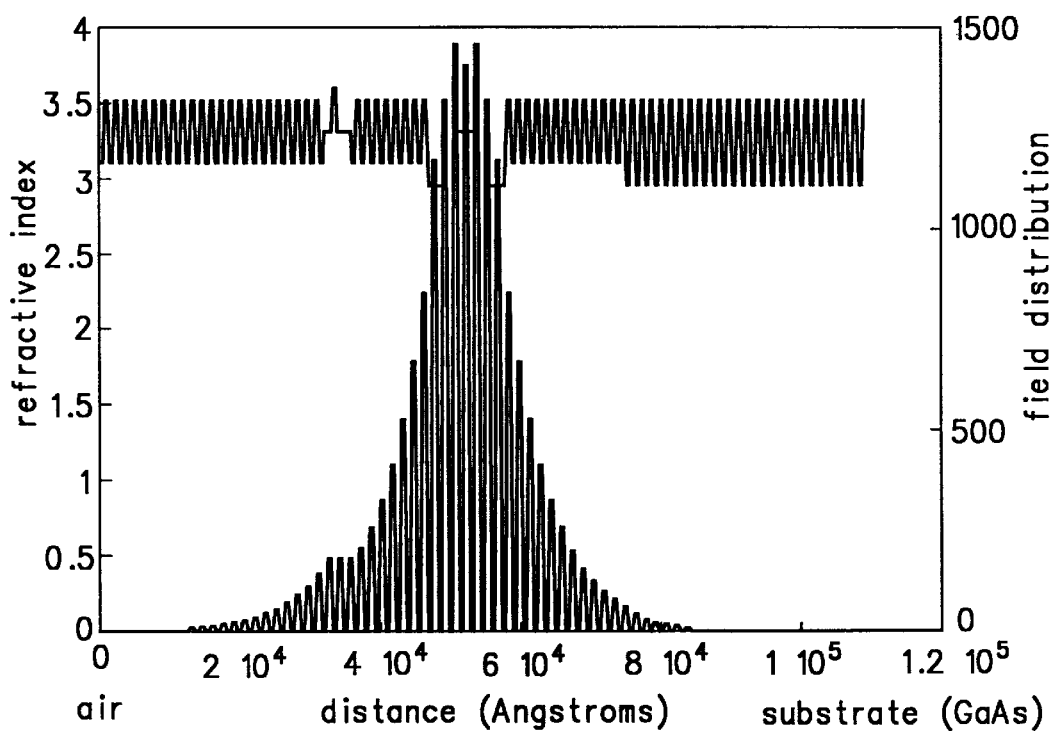
FIG. 3 illustrates the intensity-field distribution within the resonating cavity of a top-emitting device in accordance with an embodiment of the invention.

Similar steps are performed for a top-emitting VCSEL with an intracavity quantum-well photodetector. The n-contact is evaporated first followed by the p-contact. Then, the two metal contacts are annealed in a rapid thermal annealer to improve the conductivity. Finally, the sample is etched down and oxidized. The intensity-field distribution within the cavity of a top-emitting device is shown in FIG. 3.

Figure 4:
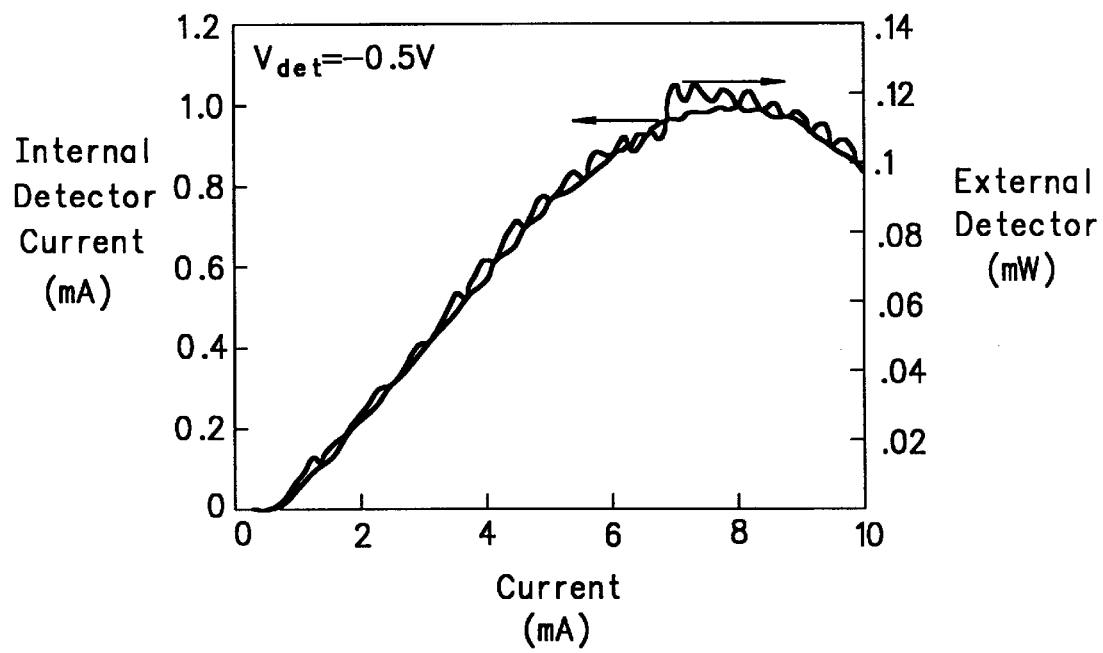
FIG. 4 illustrates light-current (L-I) characteristics of bottom-emitting devices as detected by the intracavity (or internal) and external photodetectors in accordance with the invention.

The operation of the invention and its advantages are more fully appreciated with reference to the following figures. FIG. 4 illustrates the Light-Current (L-I) characteristics of a bottom-emitting device in accordance with the invention. This figure compares the internal photodetector current and the external photodetector current (calibrated to milliwatts of output power). The two L-I curves match very closely. Virtually no spontaneous emission (incoherent random fluctuations of light that is emitted, most evident below the lasing threshold) is detected. However, because it is a bottom-emitting laser, the backside reflections off the substrate interface causes ripples in the output power, as evident in the external detector trace. The ripples can be eliminated with the use of an anti-reflection coating. $V_{det}$ is the reverse bias voltage applied to the internal photodetector.

Figure 5:
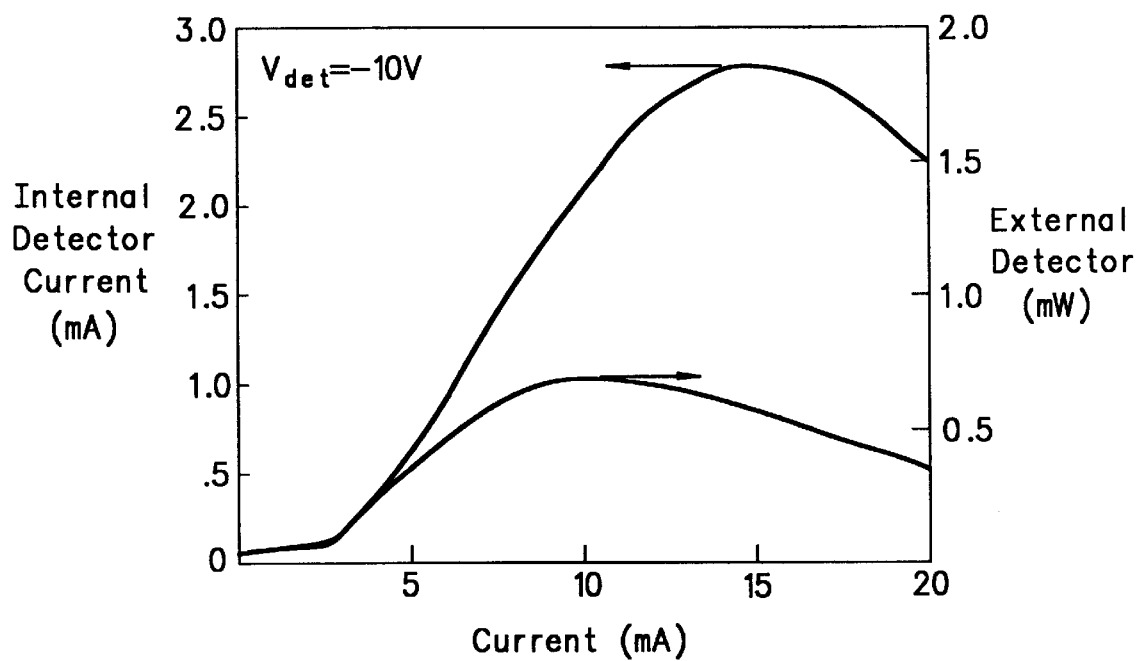
FIG. 5 illustrates light-current (L-I) characteristics of top-emitting devices as detected by the intracavity (or internal) and external photodetectors in accordance with the invention.

FIG. 5 illustrates the Light-Current (L-I) Characteristics of top-emitting devices. This graph compares the internal photodetector current and the external photodetector current. The effective detectivity (or responsivity) is 1.2 A/W. Again, virtually no spontaneous emission is detected by the internal detector. The L-I curves do not match as closely as in the case of the bottom-emitting device.

Figure 6:
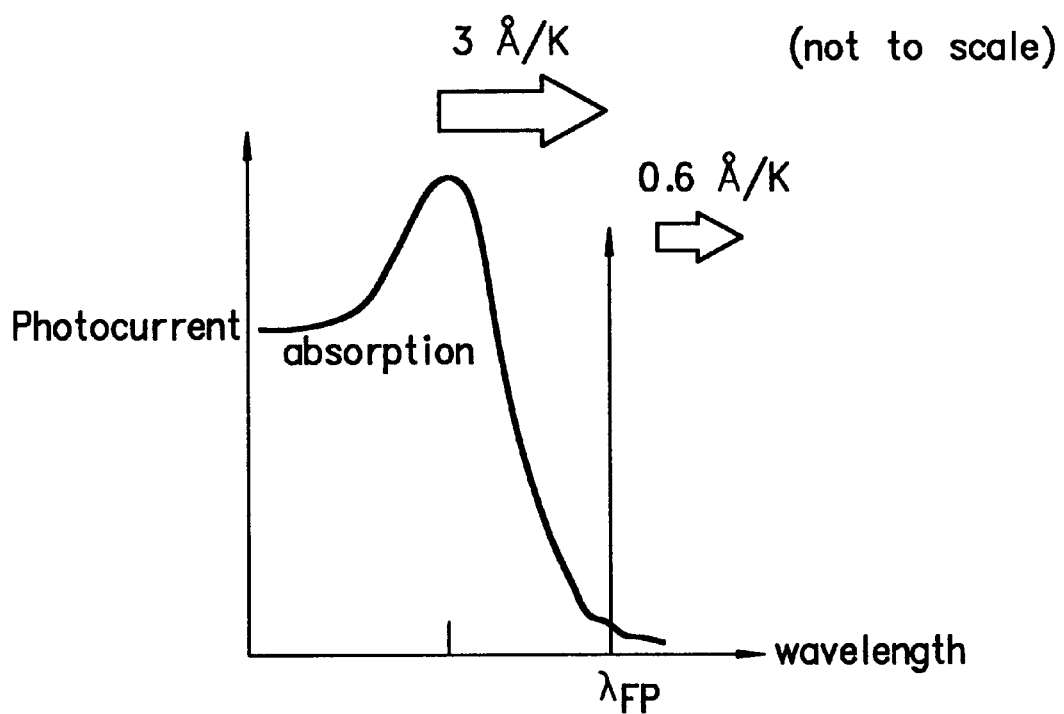
FIG. 6 illustrates light-current (L-I) mismatch due to lasing wavelength red-shifting through the detector quantum well excitonic peak.

FIG. 6 illustrates the critical nature of the relative alignment of the Fabry-Perot wavelength ($\lambda_{FP}$) and the absorber band edge ($\lambda_{abs}$). In this case, $\lambda_{FP}$ is longer than $\lambda_{abs}$. Since these two wavelengths red-shift at different rates as indicated, the lasing wavelength ($\lambda_{FP}$) rides up the absorption curve with increasing pump current (increasing temperature) and hence experiences absorption that is not constant, thereby impacting the device as an accurate integrated detector.

Figure 7:
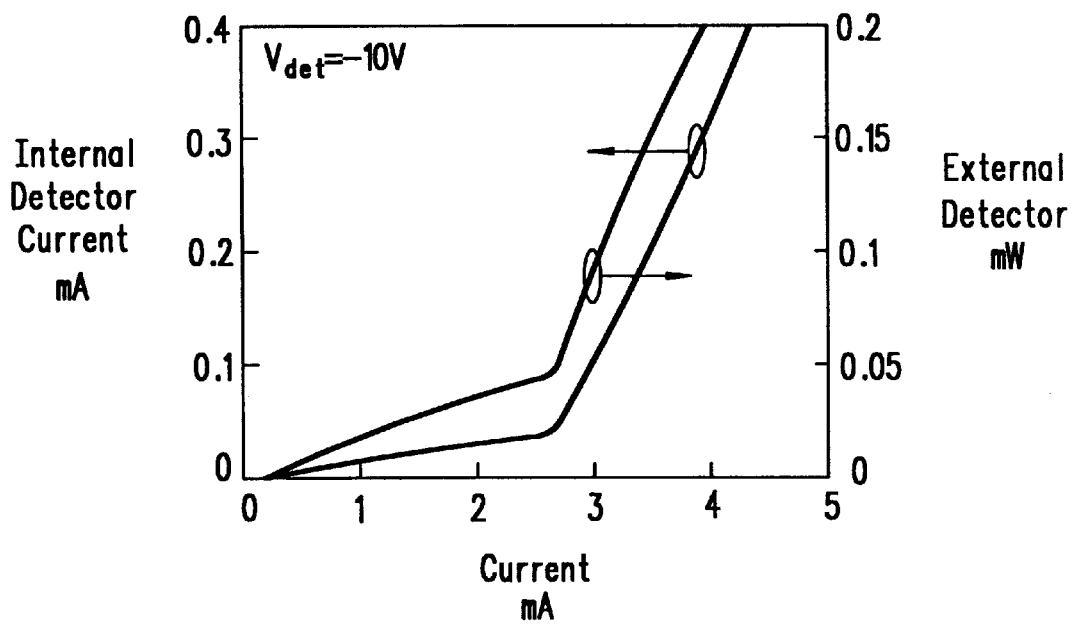
FIG. 7 illustrates minimal detected spontaneous emission for a top-emitting device constructed in accordance with an embodiment of the invention.
Figure 8:
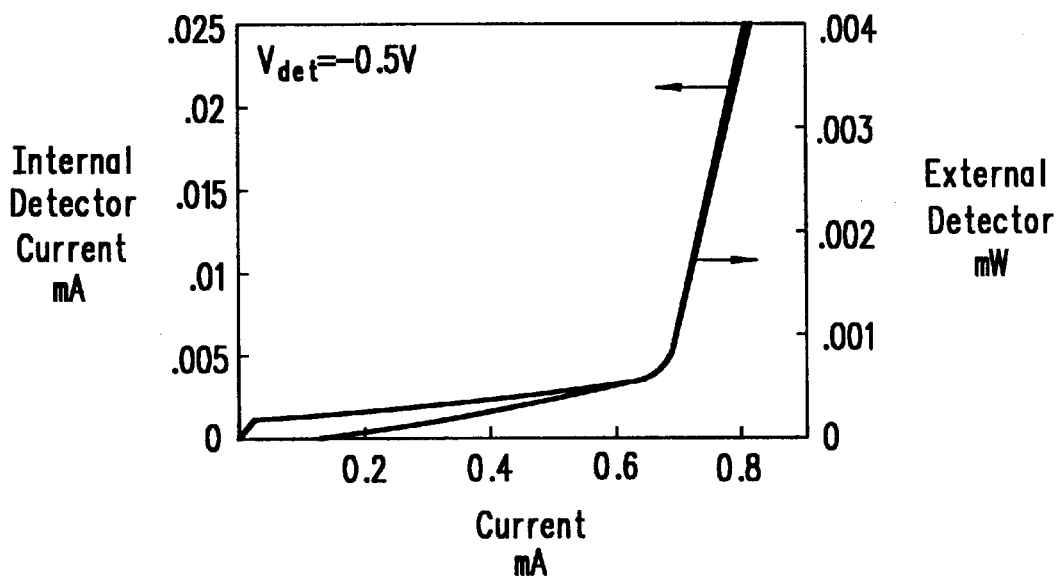
FIG. 8 illustrates minimal detected spontaneous emission for a bottom-emitting device constructed in accordance with an embodiment of the invention.

FIG. 7 illustrates minimal detected spontaneous emission for a top-emitting device, while FIG. 8 illustrates minimal detected spontaneous emission for a bottom-emitting emitting device. These figures actually magnify the behavior of the L-I curves from previous figures so that one can more clearly observe the spontaneous emission. For both bottom- and top-emitting structures, the amount of spontaneous emission detected by the internal detector is as low as (in the bottom-emitting case) and even lower (in the top-emitting case) than an external detector. This effect is due to the fact that the quantum well is placed at a resonant position to detect only the Fabry-Perot wavelength and hence is not as sensitive as bulk material to the broadband nature of spontaneous emission.

Figure 9:
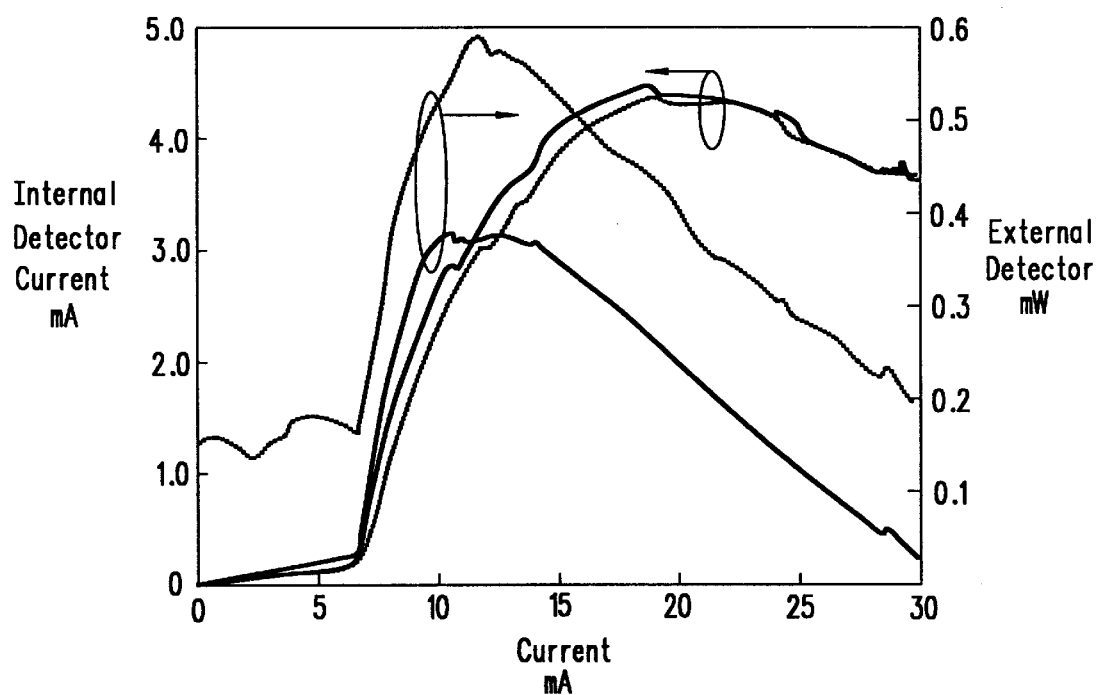
FIG. 9 illustrates that a device in accordance with the invention is much less sensitive to external light than an external photodetector.

FIG. 9 illustrates the response of a top-emitting device to external light. In particular, the figure shows how insensitive the device is to external light. The solid lines represent the internal and external detectors without any external light applied to an experimental measurement setup. The dotted lines show the responses when external light is shone onto the setup. The external detector response shows a large jump, while the internal detector is virtually unaffected.

Figure 10:
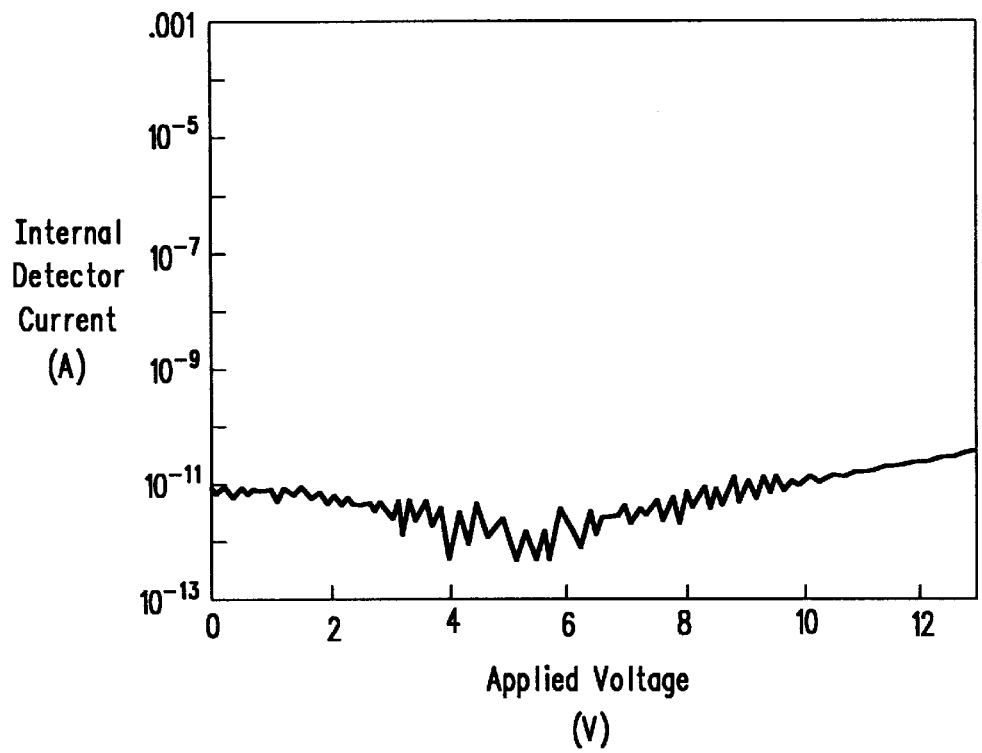
FIG. 10 illustrates the dark current associated with a device constructed in accordance with an embodiment of the invention.

FIG. 10 illustrates the dark current characteristics of the device of the invention. The dark current is the amount of current that the detector exhibits when there is no light or signal for it to detect. The lower the dark current, the more sensitive the detector is to any signal. The device of the invention demonstrates pA (picoAmperes) of dark current, which is as low as any commercially available detector. In fact, the measurements have been limited by the measuring instrument's noise floor so that the true dark current may be even lower.

Figure 11:
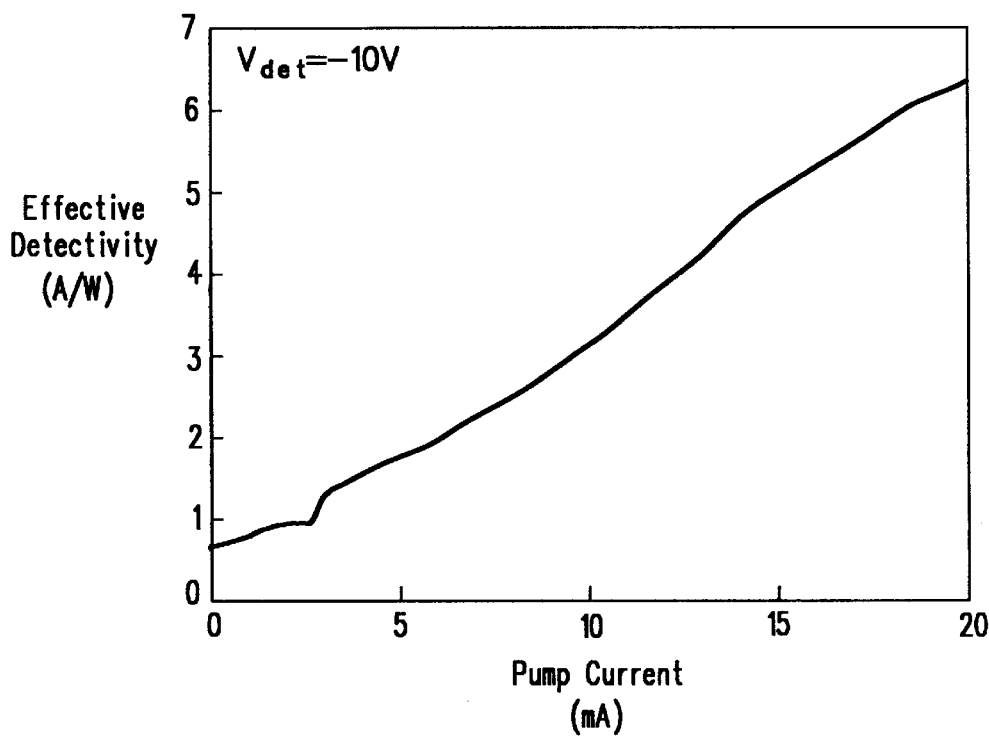
FIG. 11 illustrates the effective detectivity of the internal detector as a function of laser pump current for a device constructed in accordance with the invention.

FIG. 11 illustrates the internal effective detectivity of a device of the invention. The figure shows the effective detectivity as a function of the laser pump current. The effective detectivity is at least 1 A/W around the threshold. This high responsivity results from tailoring the detector quantum well's overlap with a peak of the intensity field distribution within the lasing cavity. The detectivity's increase with pump current is a result of the lasing wavelength shifting through the detector's excitonic peak.

Figure 12:
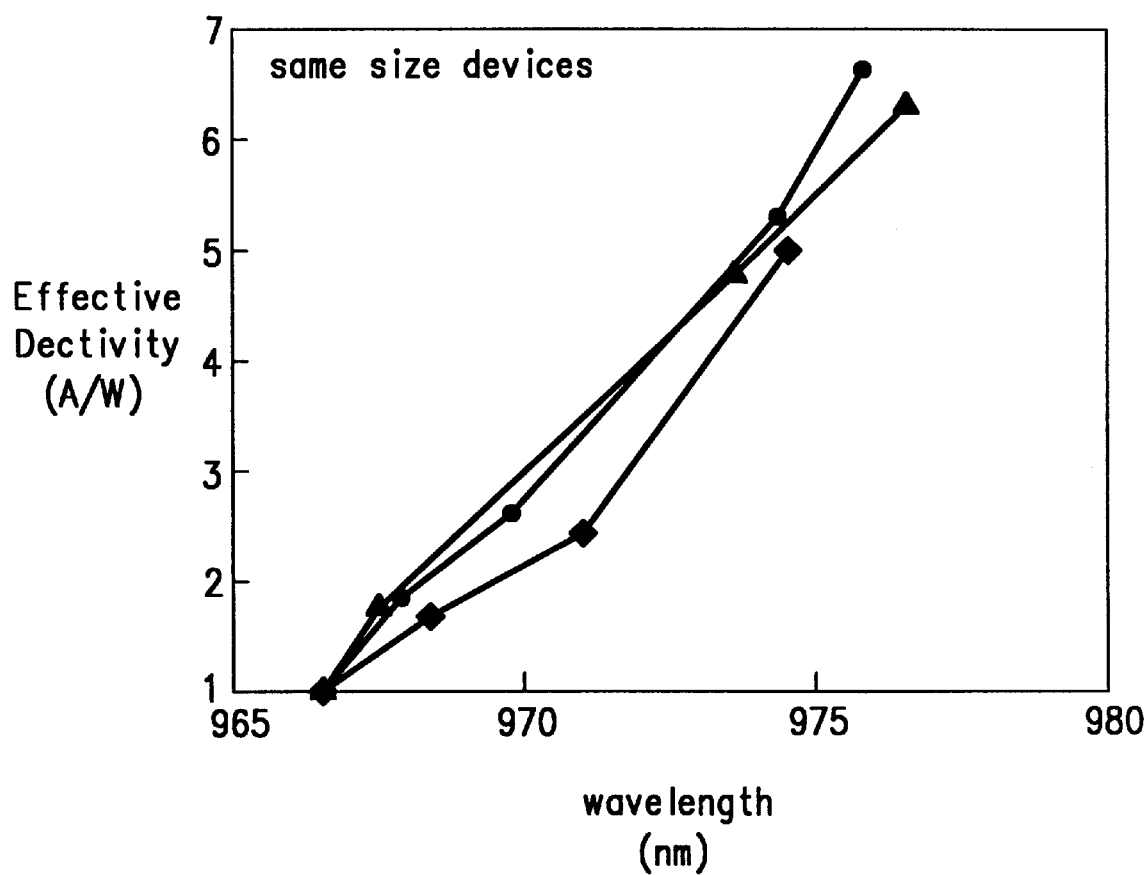
FIG. 12 illustrates the effective detectivity of three devices constructed in accordance with the invention, showing increased detectivity with increasing wavelengths.

FIG. 12 is a plot of the internal effective detectivity versus wavelength. This figure compares three devices of the same size and characteristics. The effective detectivity rises with increasingly longer wavelengths, bearing out the explanation of the excitonic enhancement due to the detector quantum well.

Figure 13:
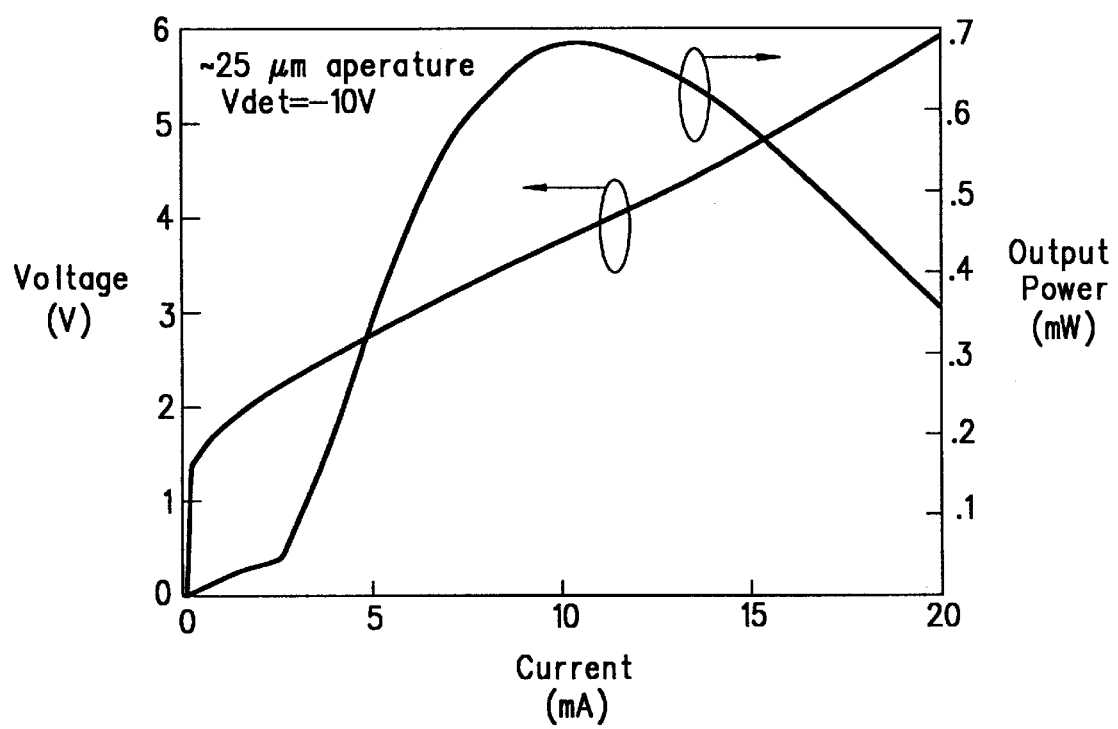
FIG. 13 illustrates the voltage behavior of a device in accordance with an embodiment of the invention.

FIG. 13 illustrates Current-Voltage (I-V) Characteristics of a device of the invention. The figure shows a device threshold voltage of 2.2V.

Figure 14:
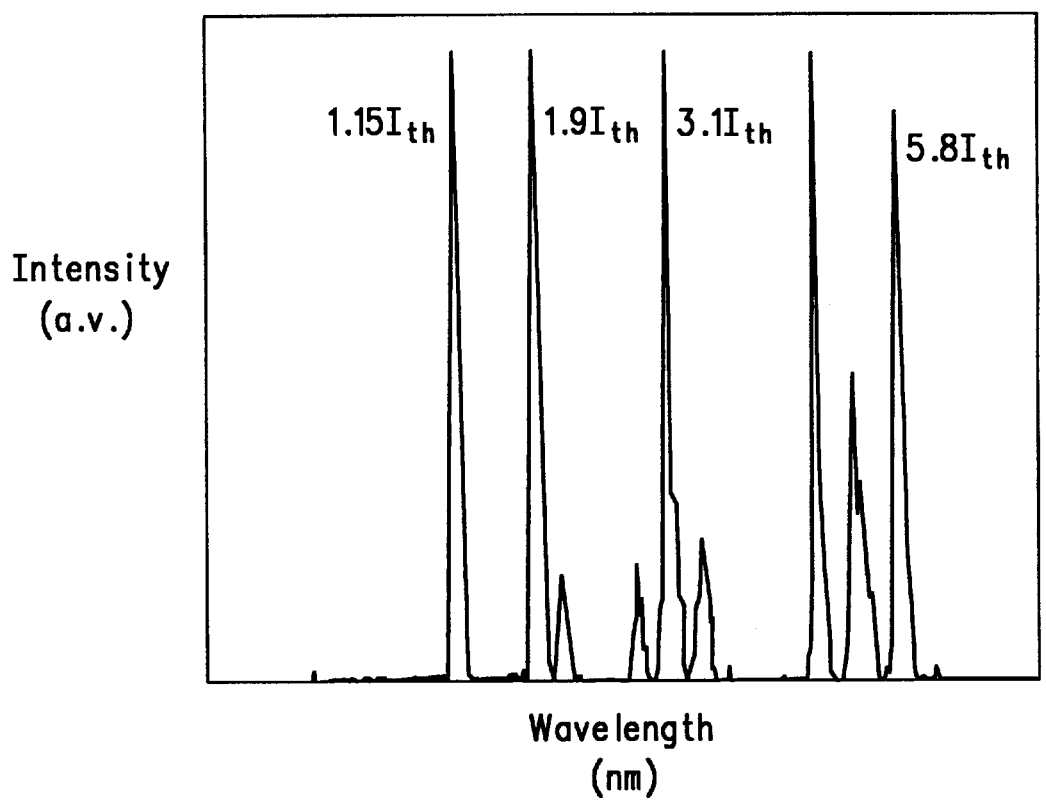
FIG. 14 illustrates the output spectra of a top-emitting device in accordance with an embodiment of the invention.

FIG. 14 illustrates the spectra of a top-emitting device in accordance with the invention. The output spectra of a device is tailored for specific applications. The device of this example was designed to lase at 980 nm. The actual wavelength produced is around 966 nm, as shown in the plot. The device starts out single-mode (no side lobes due to transverse modes) and becomes multi-mode at longer wavelengths with increasing pump current.

The invention has now been fully described. Attention presently turns to a discussion of the benefits associated with the invention, followed by a discussion of alternate embodiments in accordance with the invention.

A primary benefit of the invention is that it avoids bulky external detectors and accompanying optics. Another primary benefit of the invention is that its performance is superior to that of other monolithic sensors that are positioned on the top, bottom, or side of a VCSEL. Advantageously, the embedded nature of the quantum-well photodetector 50 between the p-doped DBR mirror stack 36 and the n-doped DBR mirror stack 60 renders the photodetector highly insensitive to spontaneous emission and ambient light. This is in contrast to existing prior monolithic devices where the photodetector is essentially an external detector. The quantum well, with its embedded position, prevents stray light from interfering with the power detection and monitoring, while its thin active region minimizes dark current.

Advantageously, the device uses a quantum well as the detecting or absorbing medium, instead of a bulk material. This, coupled with its intracavity location, allows the quantum well to operate at a peak of the intensity distribution inside the lasing cavity so that it can sample a large quantity of light and hence be highly responsive. The invention also exploits the fact that the quantum well is resonant at the Fabry-Perot wavelength of the VCSEL.

The intracavity resonant quantum well photodetector of the invention achieves very high effective responsivity, on the order of 1 A/W (Ampere/Watt). Ordinary external silicon photodetectors have about 0.6 A/W responsivity.

The photodetector detects virtually no spontaneous emission. This is important since it is desirable to modulate near threshold, and the spontaneous emission would decrease the on-off ratio necessary for a clean signal. Also, the minimal detection of spontaneous emission leads to a very clear output light-current (L-I) curve necessary for determining the threshold current with accuracy. Prior art devices commonly correct their L-I curves by subtracting the spontaneous emission.

A variety of alternate embodiments of the invention may be constructed. For instance, quantum well design parameters such as quantum well thickness and energy depth, quantum well location within the structure, and the number of quantum wells may be varied. In addition, the active and photodetector quantum wells may be of different compositions to control the excitonic enhancement and bias behavior.

Wet-etching processes were described, but dry-etching through reactive ion etching or ion-milling may also be used. In addition, other material systems, such as GaAs, InGaP, and InGaAsP for laser output in a variety of wavelengths may be used. A variety of substrates may also be used with different material systems.

The wafer may be grown on a semi-insulating substrate to reduce absorption. In the alternative, the wafer may be grown on a p+ substrate for compatibility with integrated circuit drivers. An air bridge contact between the contacts of the device and larger contact pads may be used. A structure illustrating this concept is shown in FIG. 15.

Figure 15:
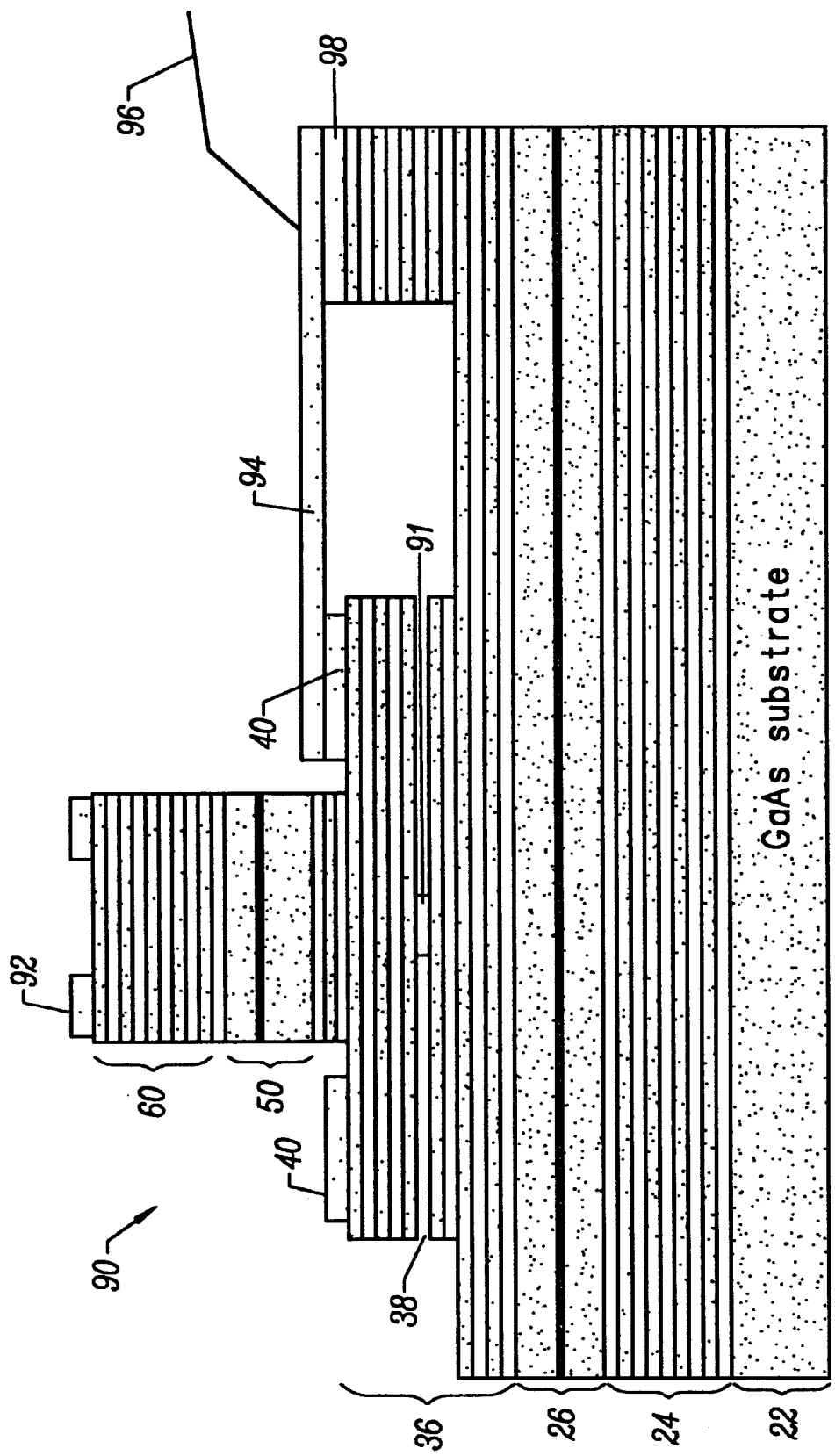
FIG. 15 illustrates an air bridge contact structure in accordance with an embodiment of the invention.

The device 90 of FIG. 15 generally corresponds to the device 20 of FIG. 1. In particular, the device 90 includes, a GaAs substrate 22, an N-doped DBR mirror stack 24, an active gain region 26, and a p-doped DBR mirror stack 36. In the embodiment of FIG. 15, the confinement layer 38 is in the form of an air gap. A spacer 91 is used as a current channel and for structural support, but the remaining region in the plane of the spacer 91 is air.

The device 90 also includes a quantum well detector 50 and an n-doped mirror stack 60. The contact 92 on top of the n-doped mirror stack 60 is annular, thereby allowing light to exit through its aperture. Thus, the device of FIG. 15 is a top-emitting device.

FIG. 15 also illustrates an air bridge 94 extending from the p-contact 40. The distal end of the air bridge 94 may be contacted with a probe 96. An insulating layer 98, such as silicon nitride, is used for insulation so that the pump current does not go directly down into the device 90. The air bridge 94 is used to extend the p-contact 40 since probe pressure directly above the air gap 38 would destroy the gap. In addition, his geometry enables the use of larger probe tips for ease of measurement. Naturally, this technique can be used if the air gap is replaced with oxidized AlAs or some other dielectric layer.

Figure 16:
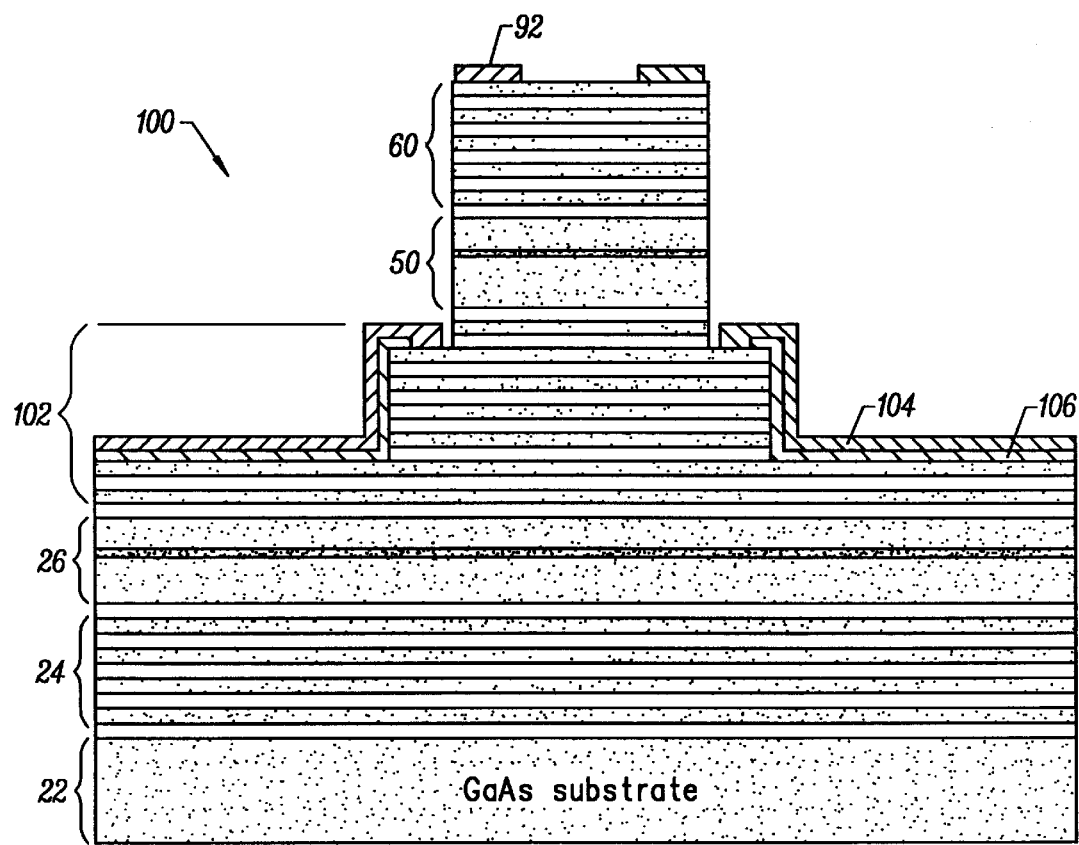
FIG. 16 illustrates a ridge waveguide structure in accordance with an embodiment of the invention.

The device of the invention may be formed with a ridge waveguide geometry. FIG. 16 illustrates such a device. The device 100 of FIG. 16 generally corresponds with the device 20 of FIG. 1. In particular, the device 100 includes, a GaAs substrate 22, an N-doped DBR mirror stack 24, and an active gain region 26. However, unlike the device of FIG. 1, a ridge waveguide geometry exists in a p-doped DBR mirror stack 102. The p-contact 104 is formed on a dielectric layer 106. The dielectric layer 106 is used to define a path for the current since the charged carriers cannot penetrate the insulating dielectric.

The device 100 also includes a quantum well detector 50 and an n-doped mirror stack 60. The annular contact 92 indicates that the device 100 is a top-emitting device.

Figure 17:
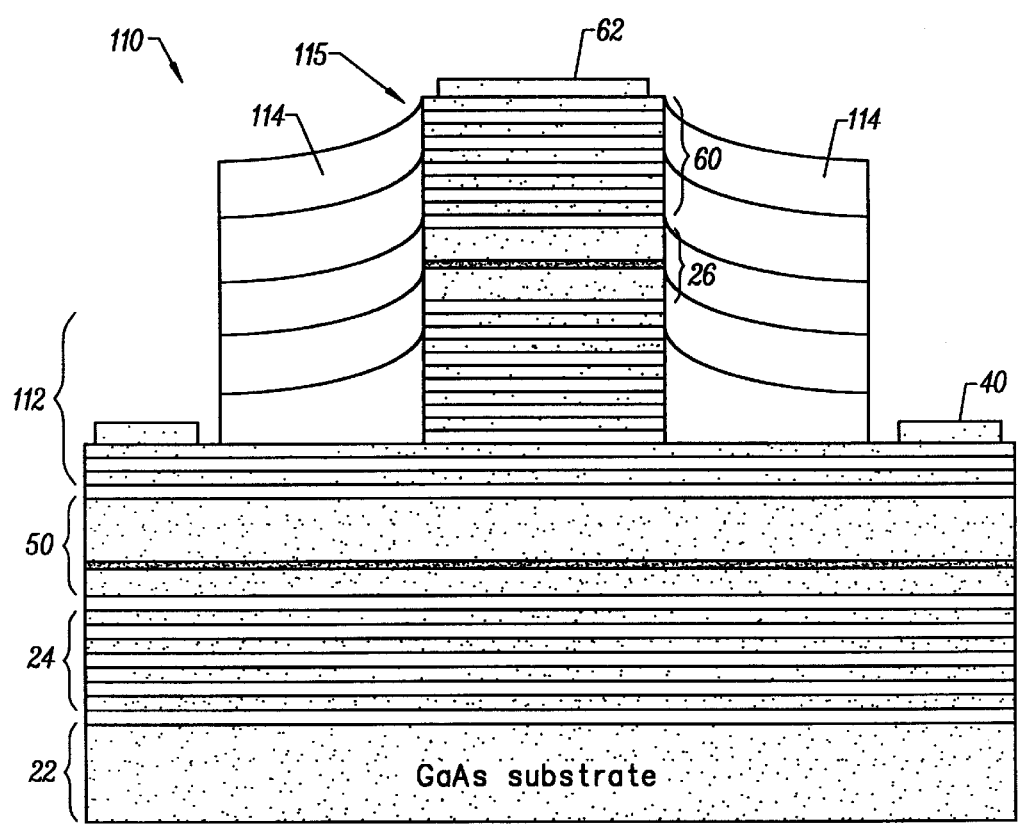
FIG. 17 illustrates buried heterostructure layers in accordance with an embodiment of the invention.

The invention may also be implemented in a buried heterostructure design. Such a structure is illustrated in FIG. 17. The device 110 of FIG. 17 includes a GaAs substrate 22 with an n-doped DBR mirror stack 24 positioned on it. In this embodiment of the invention, the quantum well detector 50 is positioned on top of the n-doped DBR mirror stack 24. A p-doped DBR mirror stack 112 is positioned on top of the quantum well detector 50. The active region 26 is positioned on top of the p-doped DBR mirror stack 112. An n-doped DBR mirror stack 60 is positioned on top of the active region 26, and an N-contact 62 is provided on top of the device 110. Regrown buried heterostructure (BH) layers 114 are grown onto the device after the pillar 115 has been etched down. These BH layers 114 provide index-guiding for the light as well as some current confinement.

Figure 18:
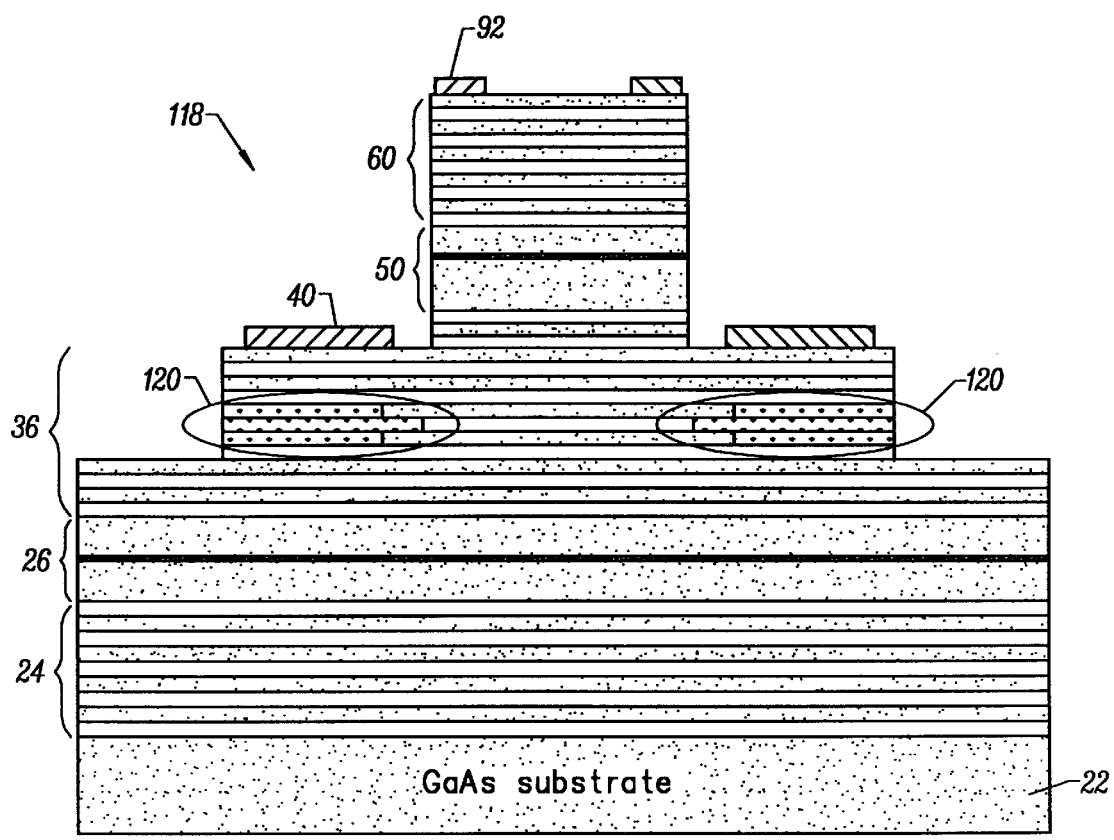
FIG. 18 illustrates a proton implantation current confinement structure in accordance with an embodiment of the invention.

FIG. 18 illustrates a device with current confinement through proton implantation. The device 118 generally corresponds to the device of FIG. 1. However, the current confinement in the device of FIG. 18 is achieved by proton implantations 120. In particular, the figure illustrates a proton (H+) implanted structure 120, which serves to confine current. This proton implant can be achieved through shadow-masking (i.e., putting an appropriate mask on the sample, tilting the whole sample or substrate relative to the proton beam so that at certain energies the protons penetrate down to the desired layers and leave the top layers undamaged).

Figure 19:
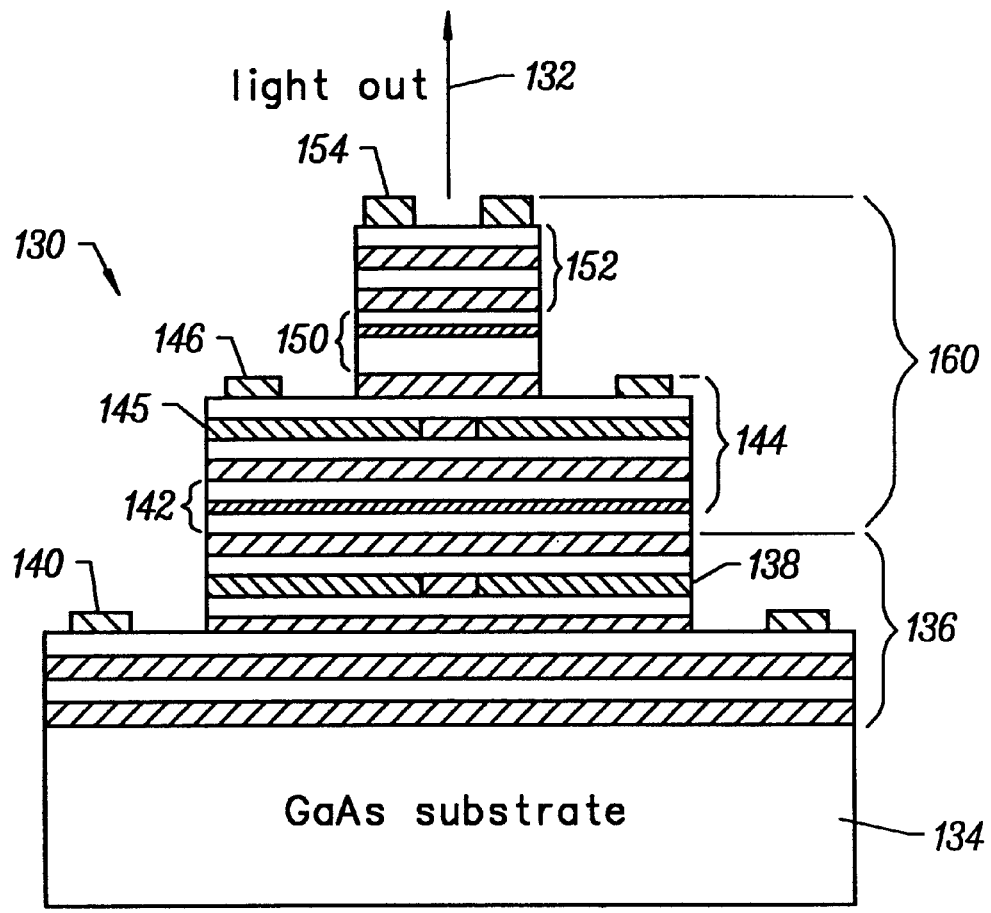
FIG. 19 illustrates a VCSEL with an intracavity quantum-well absorber in accordance with an embodiment of the invention.

Up to this point, the device of the invention has been described as a VCSEL with an integrated detector. Attention now turns to the use of the device for absorber modulation, bistable operation, self-pulsation, and optical pick-up. FIG. 19 illustrates a VCSEL used in the invention to obtain self-pulsation, optical bistability, or optical pick-up. As indicated with arrow 132, the device 130 emits light from its top.

The device 130 is constructed on a GaAs substrate 134. An n-doped bottom mirror stack 136 includes 26 pairs of AlAs/$Al_{0.15}Ga_{0.85}As$ DBRs, followed by 10 pairs of $Al_{0.2}Ga_{0.1}As/Al_{0.15}Ga_{0.85}As$ DBRs, and a $3\lambda/4$-thick $Al_{0.98}Ga_{0.02}As$ oxidation layer 138 that is one pair away from the active region 142. The n-doped bottom mirror stack 136 also includes a bottom n-contact 140.

The undoped active region 142 is composed of three 70-Å GaAs quantum wells with 100-Å $Al_{0.15}Ga_{0.85}As$ barriers all within a 1-$\lambda$ spacer.

The p-doped mirror stack 144 includes a p-doped $3\lambda/4$-thick $Al_{0.98}Ga_{0.02}As$ oxidation layer 145 that is one pair away from the active region 142. The stack 144 also includes 5 pairs of p-doped $Al_{0.9}Ga_{0.1}As/GaAs$ and 4 pairs of P+ doped $Al_{0.9}Ga_{0.1}As/Al_{0.15}Ga_{0.85}As$ for the p-contact 146.

The device 130 also includes an optical absorber 150, also referred to herein as a quantum well absorber or modulator 150. The absorber 150 includes a 90-Å GaAs undoped quantum well absorber with 90-Å $Al_{0.15}Ga_{0.85}As$ barriers all within a $5\lambda/4$ spacer, with the quantum well positioned $3\lambda/4$ of the way into the spacer from the substrate side.

An n-doped top mirror stack 152 is at the top of the device 130. This stack may be implemented with 19.5 pairs of n-doped $Al_{0.9}Ga_{0.1}As/Al_{0.15}Ga_{0.85}As$. The stack 152 includes a top n-contact 154.

The described n-p-n device 130 may be considered to comprise a bottom DBR stack 136 and a top DBR stack 160, which includes the active region 142, p-doped mirror stack 144, optical absorber 150, and n-doped top mirror stack 152. The p-n junction between the bottom stack 136 and the top stack 160 serves as the active element or gain element 142. The top n-p junction (between p-doped mirror stack 144 and n-doped top mirror stack 152) serves as the voltage controlled optical absorber 150.

The optical absorber 150 has been placed at an optical intensity peak within the DBR stack, resulting in high impact on the device output for a small modulating voltage. The absorber 150 consists of a spacer (at least $3\lambda/4$ thick) containing one or more quantum wells placed at a peak of the optical field intensity at the Fabry-Perot wavelength. The absorbing quantum wells' absorption edge should be positioned so that a zero applied voltage bias, the Fabry-Perot wavelength ($\lambda_{FP}$) is longer or redder than the absorption edge ($\lambda_{abs}$). This wavelength difference depends on the quantum-well composition. The Fabry-Perot wavelength should be positioned so that it overlaps with the tail of the quantum-well adsorption spectrum at zero bias, but when a non-zero bias is applied (causing the absorption edge to shift towards longer wavelengths), the excitonic peak should still be prominent enough when it sweeps through the Fabry-Perot wavelength. The optical absorber 150 may also be implemented at off-peak positions.

The device 130 has been implemented with a bottom mirror reflectivity of 99.995% at 852 nm, the intended Fabry-Perot wavelength $\lambda_{FP}$. The top mirror reflectivity without absorption is designed to be 99.89% at $\lambda_{FP}$. By assuming a loss of 5000 $cm^{-1}$ in the absorber quantum well, the top mirror reflectivity drops to 99.68% at 852 nm, enabling the laser to turn-off.

Figure 38:
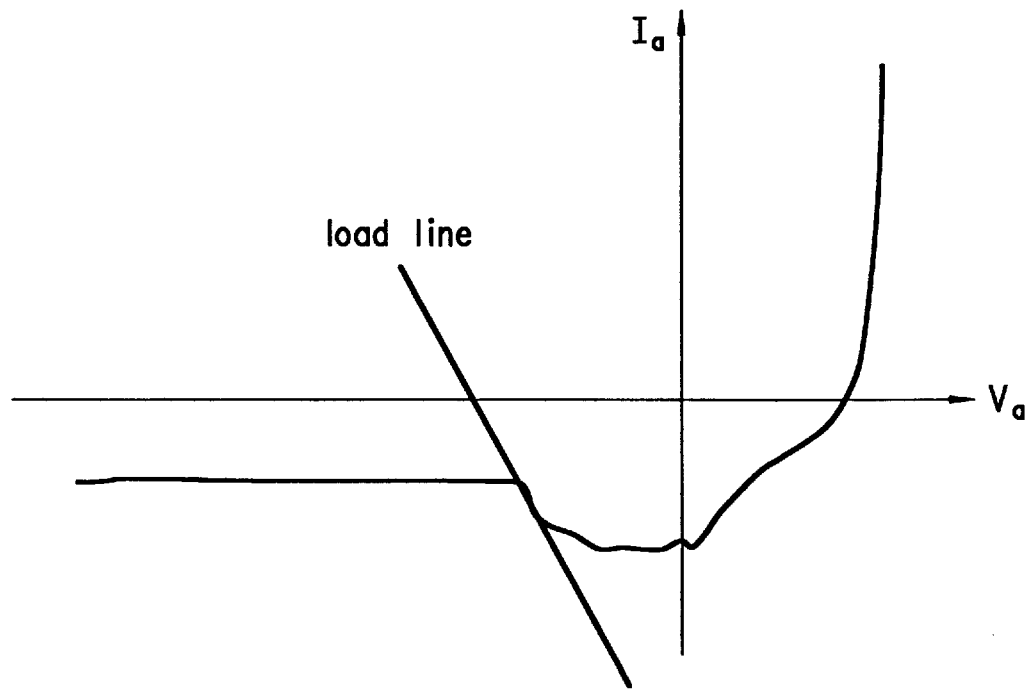
FIG. 38 illustrates the selection of the DC absorber bias (R and $V_o$ in FIG. 20) such that the operating load line is tangential to the absorber current versus voltage ($I_a$-$V_a$) trace. This choice of load line yields self-pulsation of the device.

To establish self-pulsation, the device is designed with the Fabry-Perot wavelength longer than the absorber band-edge ($\lambda_{FP} > \lambda_{abs}$) in order to obtain negative differential resistance in the absorber. The device is biased using the circuitry shown in FIG. 20. As discussed below, the DC absorber bias loads, R and $V_o$, are chosen such that the operating load line is tangential to the absorber $I_a$-$V_a$ trace, as shown in FIG. 38. This operating condition leads to controllable self-pulsation of the device. By simply varying the electrical bias conditions, the user can turn the self-pulsations on and off and can tune the frequency at which the self-pulsations occur. Furthermore, because the device is designed ($\lambda_{FP} > \lambda_{abs}$) to obtain very sharp negative differential resistance in the absorber, self-pulsation can be obtained at high laser powers using a small absorber bias.

Figure 20:
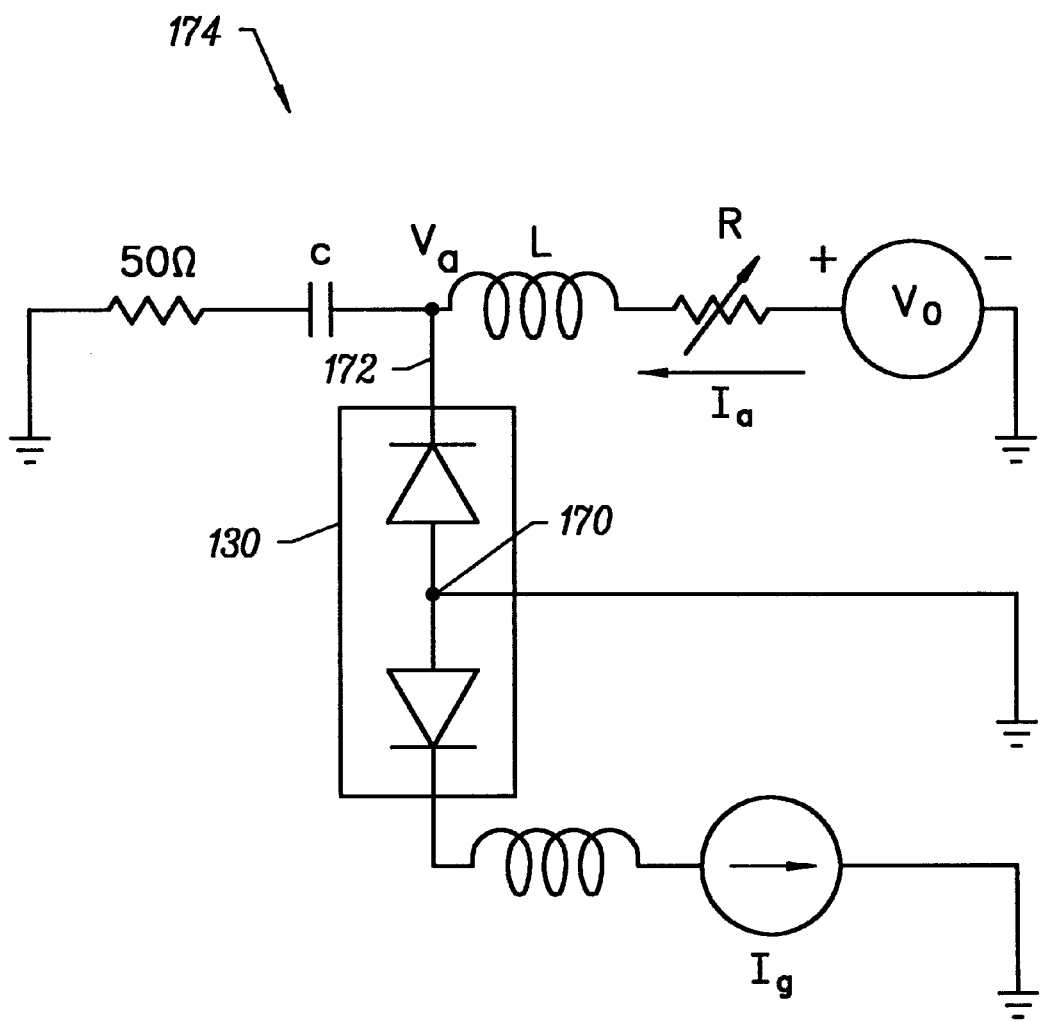
FIG. 20 illustrates a bias-T circuit operated in connection with an embodiment of the invention.

FIG. 20 illustrates a circuit used to establish self-pulsation in the device 130 of the invention. The optical absorber 150 of the device 130 is biased with a voltage source, producing voltage $V_o$ in series with a variable resistor R, as shown in FIG. 20. A termination path is provided for any generated AC signal in the absorber. The circuit of FIG. 20 allows the user to control the device operating point in order to achieve self-pulsation, bistability, or normal lasing. Node 170 of the absorber junction (the end that is shared by the gain region) is grounded. Node 172 is attached to a bias-T circuit 174 with a first branch including a capacitor C in series with the 50-Ohm resistor to provide a path for the generated AC signal, and a second branch including an inductor L in series with a potentiometer (producing variable resistance R) and a DC voltage source producing voltage $V_o$. R and $V_o$ are adjusted so that the load line for the absorber junction is tangent to the region of negative differential resistance.

Figure 21:
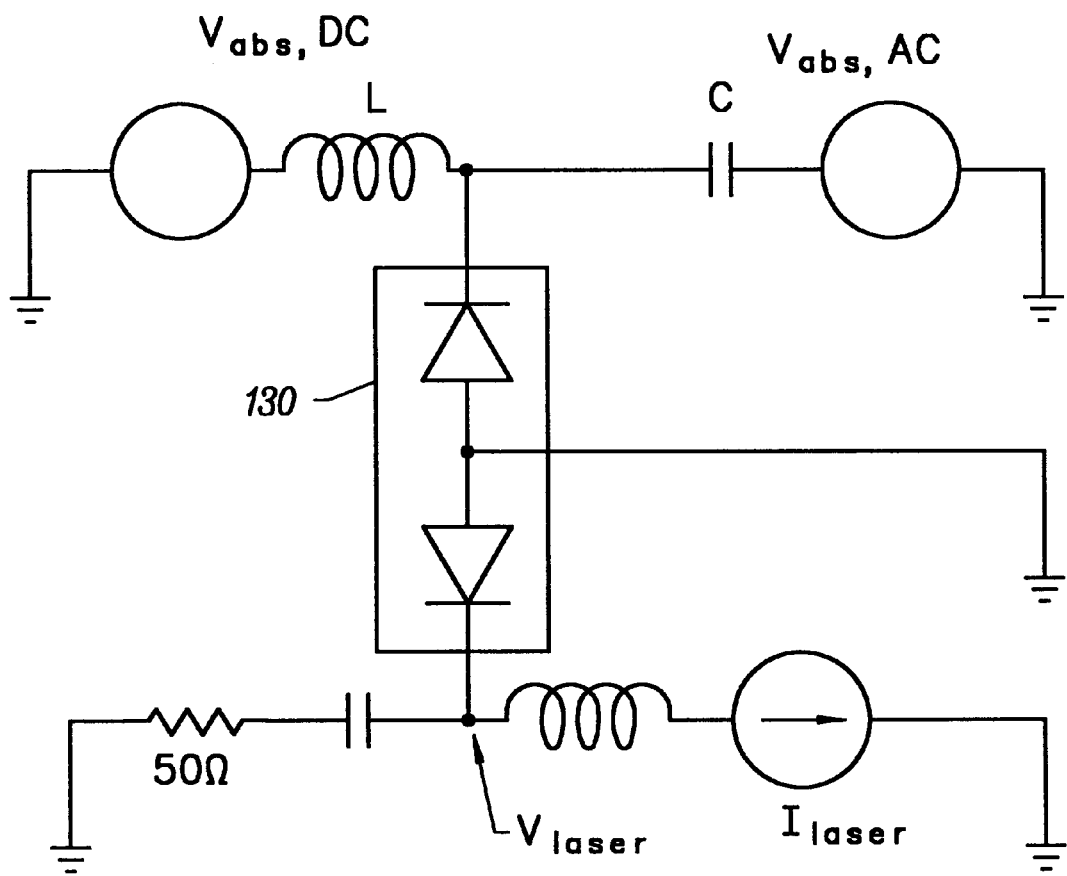
FIG. 21 illustrates a circuit that may be used to accumulate measurements associated with the operation of a device constructed in accordance with the invention.

FIG. 21 illustrates a driving circuit that may be used to modulate the device 130. The absorber 150 is reverse biased with a DC voltage source. The AC signal to the absorber is superimposed on the DC signal through the previously described bias-T circuit. The p-contact 146 serves as the common ground for both the absorber 150 and the active region 142. A DC current source is used to pump the active region 142, and a 50 Ω termination path is provided for any AC signal generated in the gain region.

Figure 22:
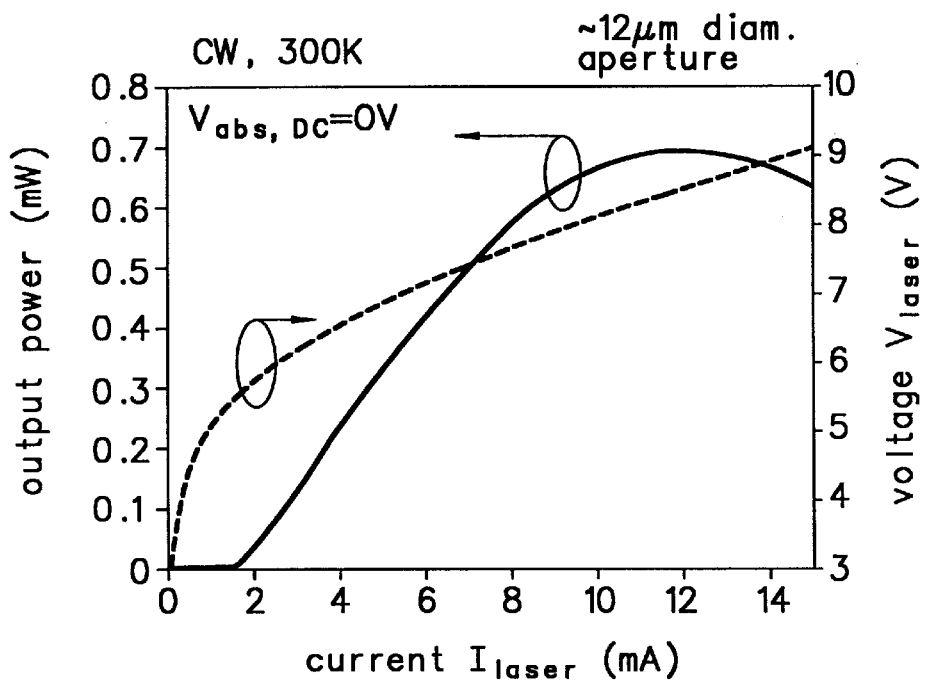
FIG. 22 illustrates the L-$I_{laser}$ and $I_{laser}$-$V_{laser}$ characteristics of a device constructed in accordance with an embodiment of the invention.

FIG. 22 illustrates the L-$I_{laser}$ and $I_{laser}$-$V_{laser}$ characteristics of an embodiment of the invention. The threshold current is 1.7 mA. The threshold voltage is 5.6 V as measured with injection between the p-contact 146 and the bottom n-contact 140. The output power typically peaks at 0.7 mW. When the absorber is on (e.g., $V_o$=2V), the threshold current does not change appreciably since the threshold current density of approximately 2 kA/$cm^2$ is already fairly high due to the mismatch of $\lambda_{FP}$ and the gain. However, the differential quantum efficiency $\eta_d$ depends more strongly on the mirror loss and hence decreases with increasing absorber reverse bias ($\eta_d$ drops by 0.2% for $\Delta V_o$=2V; peak power decreases by 20%).

Figure 23:
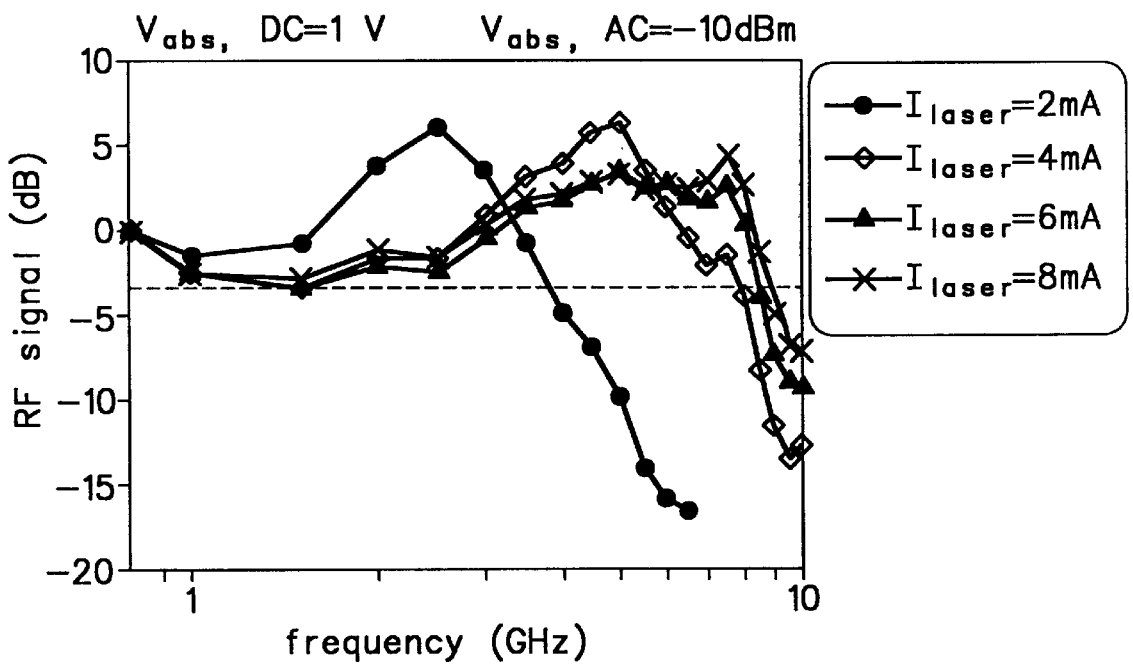
FIG. 23 illustrates device response to absorber modulation under several DC bias conditions ($I_{laser}$).
Figure 24:
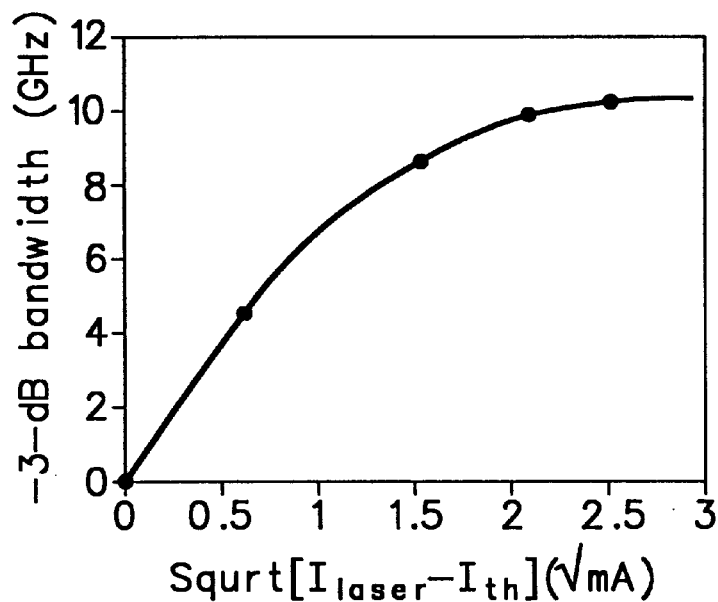
FIG. 24 illustrates bandwidth as a function of laser bias current for a device constructed in accordance with an embodiment of the invention.

FIG. 23 illustrates the device response to absorber modulation under several DC bias conditions ($I_{laser}$) for the gain region. The experimental results indicate a −3-dB small-signal bandwidth of 9 GHz at $I_{laser}$=8 mA with 0.6% modulation depth. The bandwidth as well as the relaxation oscillation frequency increase with laser bias current $I_{laser}$ as expected in conventional modulation. This functional dependence is shown in FIG. 24.

Figure 25:
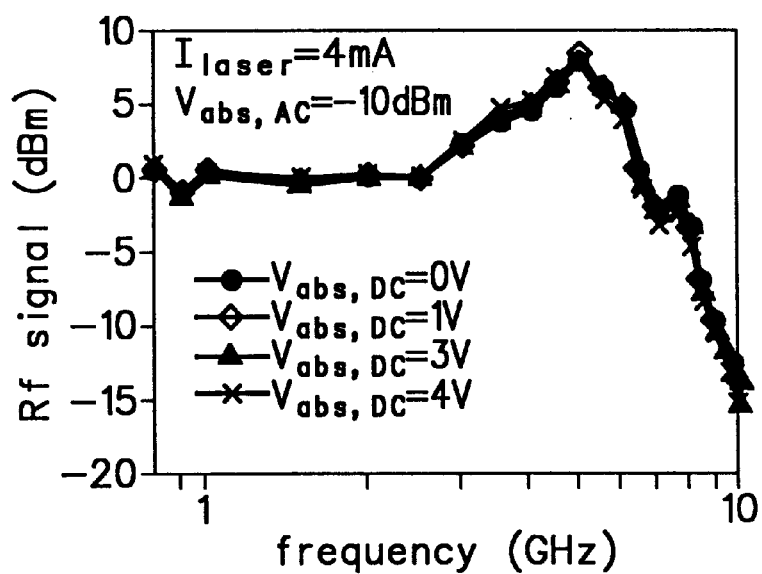
FIG. 25 illustrates a relatively constant bandwidth associated with absorber modulation response for fixed laser bias currents at different DC absorber biases.

The absorber modulation response for fixed laser bias currents at different DC absorber biases was measured. FIG. 25 illustrates that the bandwidth does not change appreciably with varying absorber DC bias.

The absorber modulation technique of the invention effectively modulates the mirror loss since the absorber is part of the VCSEL mirror stack. The mirror loss modulation in turn leads to modulation of the photon lifetime.

One design criterion for the device of the invention is the relative placement of three wavelengths: the gain ($\lambda_{gain}$), the absorber ($\lambda_{abs}$), and the Fabry-Perot transmission peak ($\lambda_{FP}$). Ideally, for maximum overlap of the gain peak with $\lambda_{FP}$, it is desirable to have $\lambda_{gain} < \lambda_{FP}$ to account for the red-shifting of the gain peak with increasing pump current and consequent heating. At the same time, the absorption edge of the quantum-well modulation should be positioned so that a small change in the applied voltage across the absorber induces a large change in the absorption. This requirement leads to the condition that $\lambda_{abs} < \lambda_{FP}$, but with these two wavelengths fairly close. Since the wavelength of the voltage-biased absorber will not shift as drastically as that of the pumped gain region, the ideal relative positioning of the three wavelengths should then be $\lambda_{gain} < \lambda_{abs} < \lambda_{FP}$.

If $\lambda_{abs} < \lambda_{FP}$ is much too long compared to the gain or absorber, more voltage across the absorber is required to shift the absorption edge and obtain modulation. This leads to poor modulation efficiency. Also, the small overlap of the gain peak with $\lambda_{FP}$ results in small bandwidth.

A large modulation depth can be achieved by aligning the Fabry-Perot wavelength to be redder than the absorber quantum-well band edge. This will result in excellent modulation depth with this absorber modulation technique. A reverse bias across the absorber can then be used to sweep the absorption edge across the laser emission, resulting in a very high on-off ratio.

Figure 26:
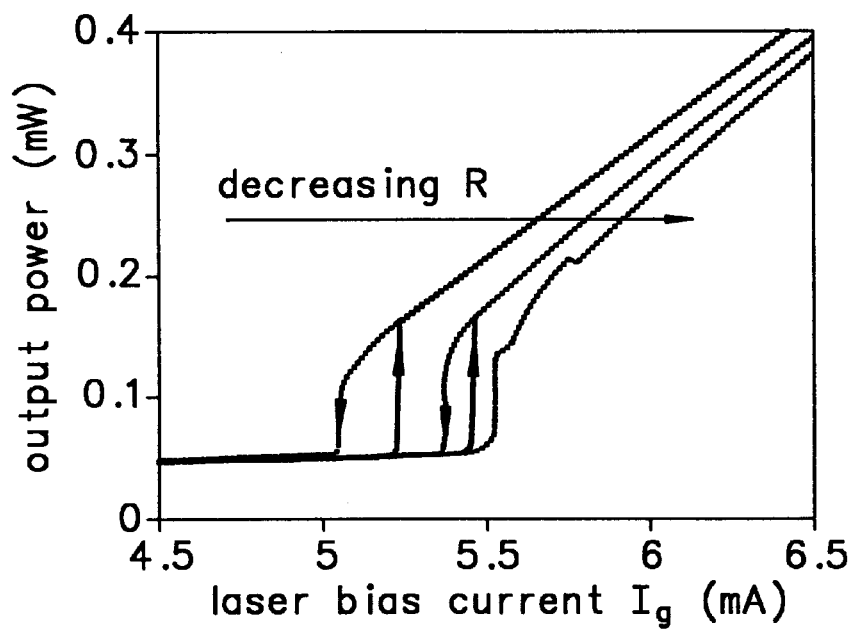
FIG. 26 illustrates output power as a function of bias current for a device of the invention.
Figure 27:
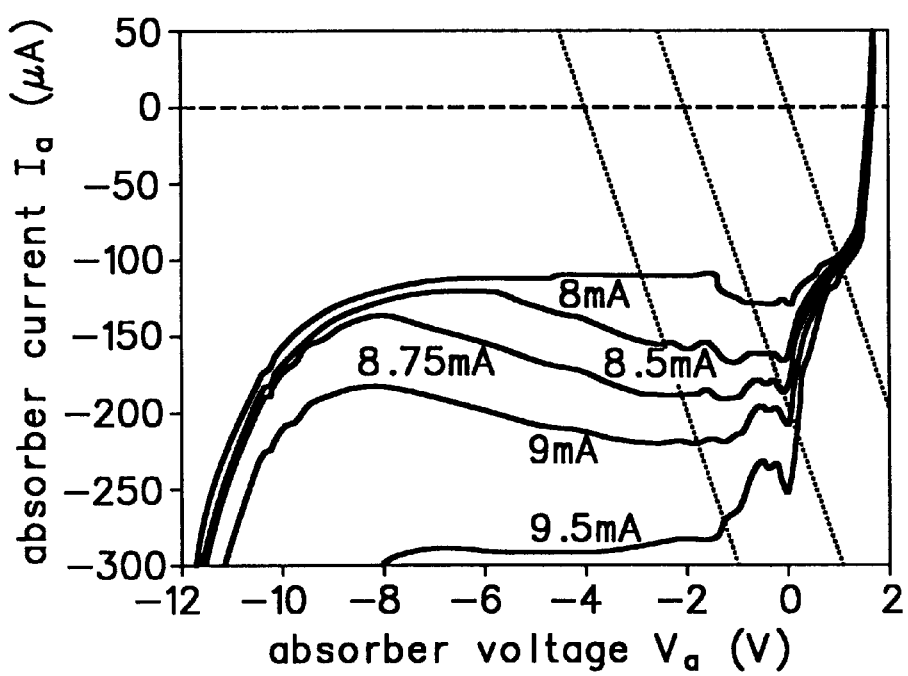
FIG. 27 illustrates absorber $I_a$-$V_a$ characteristics for a device of the invention.

FIG. 26 illustrates output power as a function of bias current. A noticeable discontinuity in $dL/dI_g$ and a hysteresis loop are observed at threshold, indicating bistable operation. As the absorber bias voltage and resistance are varied, the hysteresis loop can be made to close as shown in the figure, and the laser begins to self-pulsate. The transition between bistability and self-pulsation can also be explained using the absorber $I_a$-$V_a$ characteristics in FIG. 27. If R and $V_o$ are adjusted so that the load line crosses the absorber $I_a$-$V_a$ three times, then bistability is observed. As the load line is tilted so that it matches the negative slope of $I_a$-$V_a$ more closely, the system enters a state of instability and self-pulsations commence. The typical threshold of a 25 $\mu$m aperture self-pulsating laser occurs at approximately 8.5 mA with a voltage across the active region of approximately 3.3 volts and a peak output power of approximately 1.5 mW.

The foregoing discussion demonstrates the importance that negative differential resistance (NDR) assumes in the operation of the invention. The negative differential resistance (NDR) exhibited by the absorber $I_a$-$V_a$ traces account for the unusual behavior of this device. If the absorber bias (R and $V_o$) is adjusted so that the operating load line intersects a single absorber $I_a$-$V_a$ trace three times, then the device operates in a bistable manner. If instead the load line is tangential to the region of negative differential resistance in an absorber $I_a$-$V_a$ trace, then the device operates in an unstable state; this is the regime of self-pulsation. The device is designed to obtain regions of sharp negative differential resistance in the absorber $I_a$-$V_a$ characteristic so that relatively low absorber biases (e.g., R=10 to 100 kW, Vo=5 to 5 V) are required to obtain self-pulsation.

To ascertain whether self-pulsation can be achieved, the current-voltage ($I_a$-$V_a$) trace for the absorber was measured. Negative differential resistance (NDR) was obtained over a range of laser bias currents as shown by the $I_a$-$V_a$ characteristics of a typical saturable absorber in FIG. 27. The absorber current is proportional to the applied electric filed across the absorber junction and the optical power. When the absorber is forward biased, it behaves as a normal diode. As the absorber reverse bias increases (at the same laser bias), two competing processes affect the absorber current. The electric field causes the current to increase, whereas the increased absorption reducing the laser power causes the absorber current to decrease. For small $V_a$, the former effect dominates, while for large $V_a$, the latter effect is stronger. When the reverse bias voltage increases further, the absorption of the absorber junction is too great and the VCSEL stops lasing. The resultant drop in the optical power causes the absorber current to drop and approach the value determined solely by the applied electric field. The NDR appears in the region where the absorber current decreases with increasing reverse bias.

Figure 28:
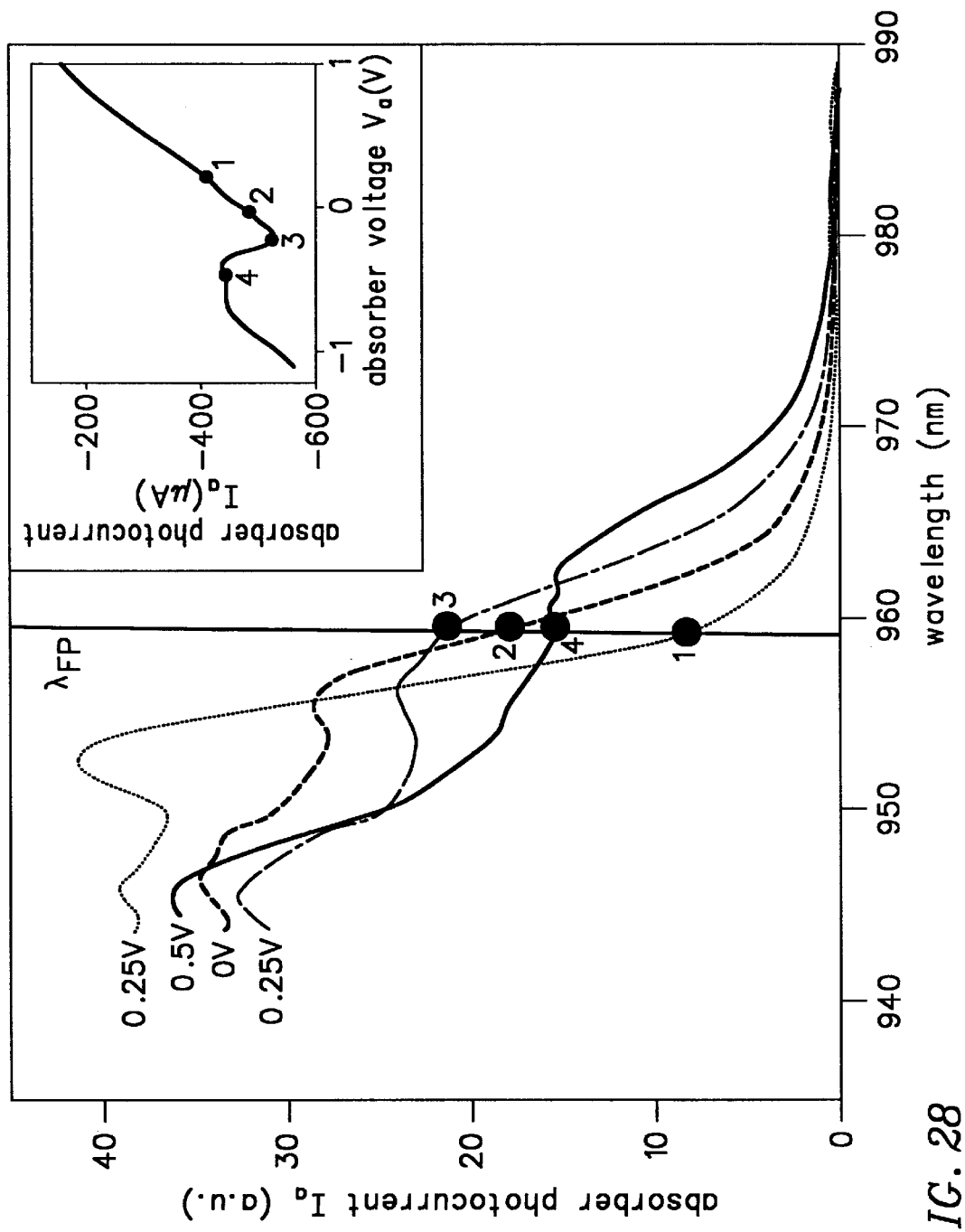
FIG. 28 illustrates the measured absorption as a function of wavelength for different reverse bias voltages. The lasing wavelength is shown as a vertical line in the figure to illustrate the variation in the relative absorption seen by the laser as the absorption spectrum shifts with reverse bias voltage.

The operation of the device of the invention is also impacted by quantum-well sub-bands of the absorber 150, as reflected in the fine features in the $I_a$-$V_a$. These features can be described as follows. The NDR is enhanced by strategic placement of the absorber and Fabry-Perot wavelengths. The absorber spectra for different reverse bias voltages are sketched in FIG. 28 as a function of wavelength. The vertical arrow shows the position of the laser emission ($\lambda_{laser}$), which is fixed when the laser bias current is fixed. Point $\alpha$ indicates the amount of absorption at $\lambda_{lasing}$ when $V_a = V_1$. When the reverse bias is increased to $V_2$, the absorption and hence the absorber current increase as the quantum-well absorption edge red-shifts, as shown by point $\beta$. When $V_a$ is increased sufficiently, then the absorption decreases to point $\gamma$, bringing the absorber current back down to a mostly constant value. Thus, the strategic placement of the Fabry-Perot wavelength and the quantum-well absorption edge significantly enhances the NDR, providing flexibility in the design for self-pulsations or bistability.

Self-pulsation was measured using a high-speed detector and an RF spectrum analyzer. The non-self-pulsating state is shown in FIG. 29(a) under conditions of stable operation. The trace essentially depicts relative intensity noise as the device behaves as a conventional laser. FIG. 29(b) shows a trace of the self-pulsation centered at 1.86 Ghz with a FWHM (−3 dB) of at most 10 Mhz for the laser bias current set at $I_g$=9 mA, the saturable absorber bias voltage at $V_o$=2 V, and the variable resistor at R=10 k$\Omega$.

Figure 29C:
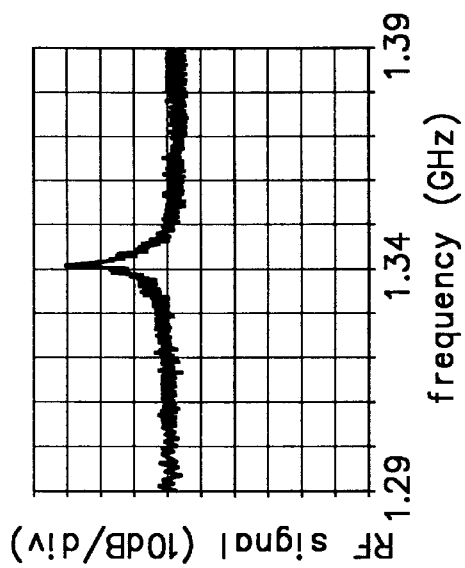
FIGS. 29(a)–29(d) illustrate self-pulsation characteristics of a device of the invention.
Figure 29D:
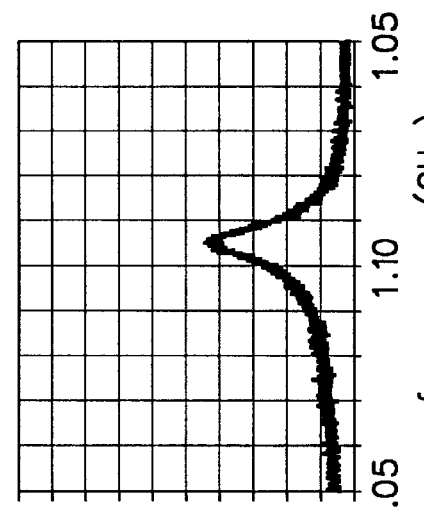
Figure 29A:
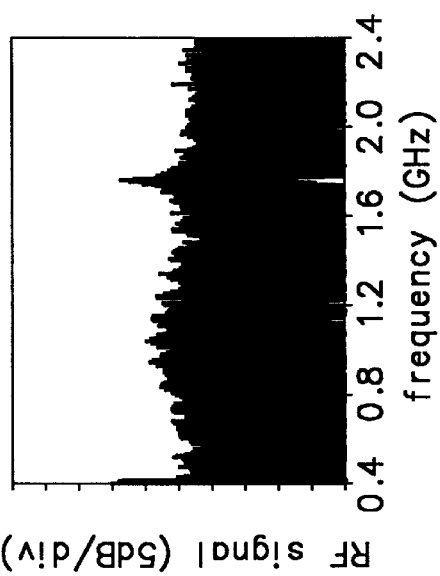
Figure 29B:
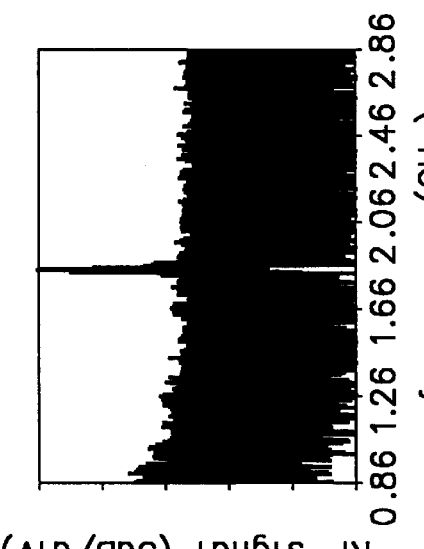

FIG. 29(c) shows the self-pulsation frequency at 1.34 Ghz with R=75 k$\Omega$ and $V_o$=6 V for a laser bias current of 6 mA. Likewise, the self-pulsation in FIG. 29(d) occurs at R=100 k$\Omega$ and $V_o$=10 V for a laser bias current of $I_g$=5.5 mA with the frequency at 1.1 Ghz.

Figure 30:
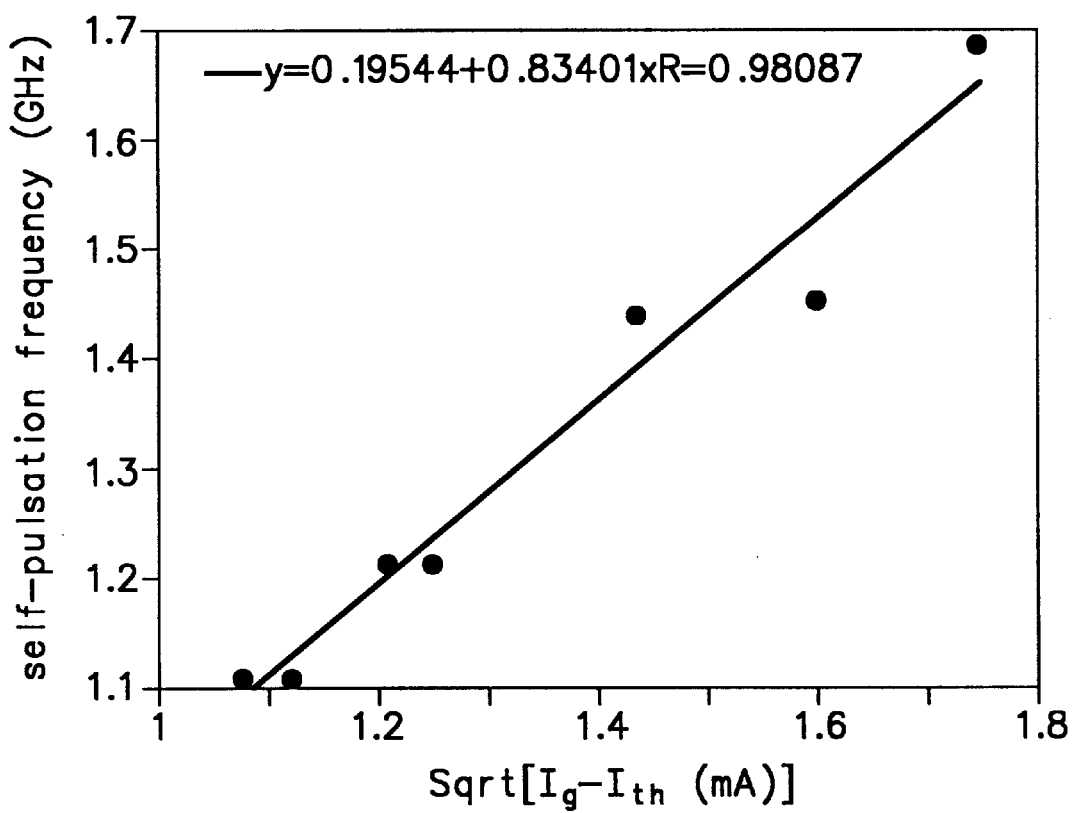
FIG. 30 shows a plot of self-pulsating frequency as a function of laser bias current $I_g$.

FIG. 30 shows a plot of the self-pulsating frequency as a function of the laser bias current $I_g$. This frequency can be tuned by adjusting the laser bias current $I_g$ as well as the saturable absorber circuit parameters (i.e. $V_o$ and R).

The device of the invention can be used for optical pick-up detection. For example, the device can be used as an integrated optical disk readout device that provides a low noise, compact alternative to existing bulk edge-emitter and external photodetector readout schemes. The negative differential resistance discussed in connection with self-pulsation is required to obtain the bistability necessary for this function. Bistable laser output is achieved by choosing R and $V_o$ such that the load line crosses the absorber I-V (current-voltage) trace three times (hence two stable solutions and one unstable one). The absorber biases R and $V_o$ are chosen to minimize the width of the hysteresis loop in the L-$I_g$ trace while maximizing the magnitude of the discontinuity in dL/dI.

Optimal, efficient pick-up detection means that a small change in the photo-generated absorber current results in a large change in absorber voltage. Therefore, the load line and hence the slope of the negative differential resistance needs to be fairly steep as in the case of self-pulsation. The use of quantum wells and their excitonic peaks in the absorber allows for such a feature.

Current optical disk readout schemes use an edge-emitting laser as the optical source and a separate external photodetector. The present invention integrates the optical source and detector into a single device. This approach eliminates noise due to reflections from unnecessary bulk optics and also minimizes the physical size of the device. Furthermore, the circular beam output allows the output beam to be focused to a spot size which is smaller than that of an edge-emitting device. Focusing the beam to a smaller spot size increases the allowable information density on optical disk. The vertical-cavity geometry allows for possible use of two-dimensional arrays, which allows for parallel readout. The two-dimensional nature of VCSELs also means wafer-scale fabrication, resulting in high device yield as well as high device density on each wafer.

Figure 31A:
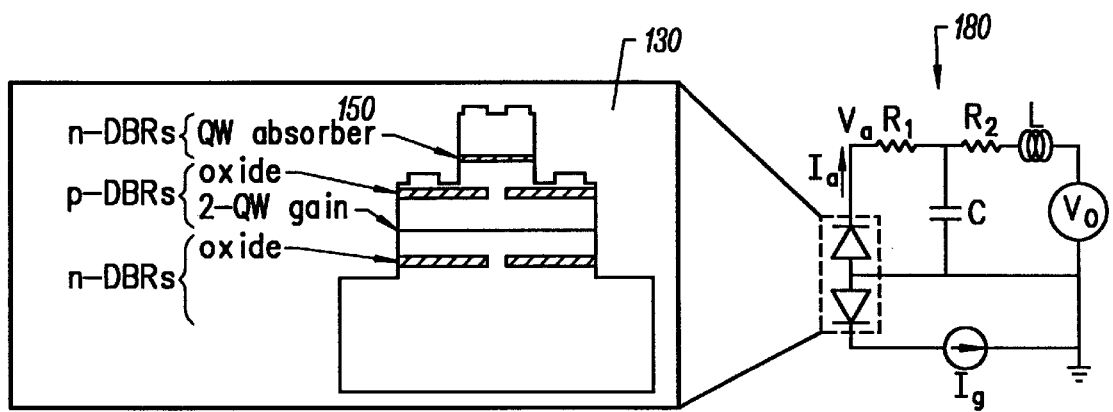
FIGS. 31(a)–31(b) illustrate the device of the invention configured as an optical pick-up device.

FIG. 31 (a) illustrates the device of the invention configured for optical pick-up. FIG. 31(a) shows bias circuitry 180 that may be used in an optical pick-up application. The absorber 150 is biased in parallel with a capacitor C (e.g., C=0.2 $\mu$F) and an inductor L (e.g., L=10H). Only DC current can flow through the branch with the inductor L; while only AC current can flow through the branch with the capacitor C. A DC voltage bias $V_o$ (e.g., $V_o$=9V) and a resistive load $R_2$ (e.g., $R_2$=112 k$\Omega$) are placed in series with the inductor L. A second resistor $R_1$ is placed in series with the absorber 150. The combined load $R_1+R_2$ and $V_o$ determine the DC bias conditions for the absorber; $R_1+R_2$ and $V_o$ are chosen such that the operating load line intersects the absorber current-voltage (I-V) trace three times in order to obtain bistable device operation. The AC current generated in the absorber flows through $R_1$ and the branch with the capacitor to ground, resulting in a time-variation in the measured voltage $V_a$ which is proportional to the magnitude of the AC current.

Figure 31B:
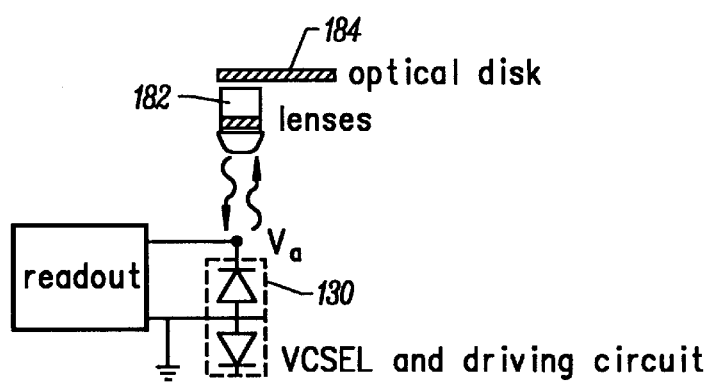

FIG. 31(b) shows the optical cavity used with the device of the invention in order to perform optical pick-up. Light emitted by the device 130 is focused with a series of collimating and focusing lenses 182 onto an optical disk 184. The light reflected from the optical disk 184 is then focused back onto the device 130, through the same series of lenses 182. The intracavity absorber 150 integrated into the device 130 responds to the reflected light with a time-varying absorber current, which is measured using the device circuitry described above.

To perform optical disk read-out, the device is biased using the circuitry shown in FIG. 31(a) and is placed in the external optical cavity shown in FIG. 31(b). A DC gain bias is applied to the device so that the device lases, and the output light is tightly focused onto the optical disk 184 to be read. The optical disk 184 reflects varying amounts of optical power, which is then focused back onto the device 130 through the same series of lenses 182. The intracavity absorber in the device responds to the varying optical power with a varying absorber current $I_a$, resulting in a measurable variation of the absorber voltage $V_a$, which functions as the optical pick-up read-out signal.

Figure 32:
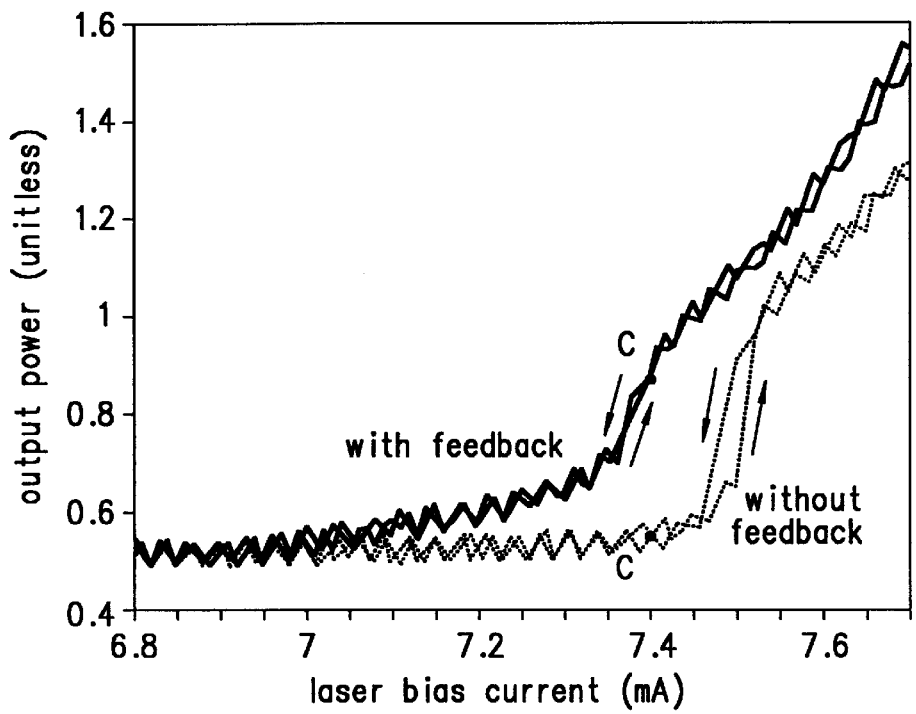
FIG. 32 shows the desired L-$I_g$ trace for the device of FIG. 31 under typical bias conditions.
Figure 36A:
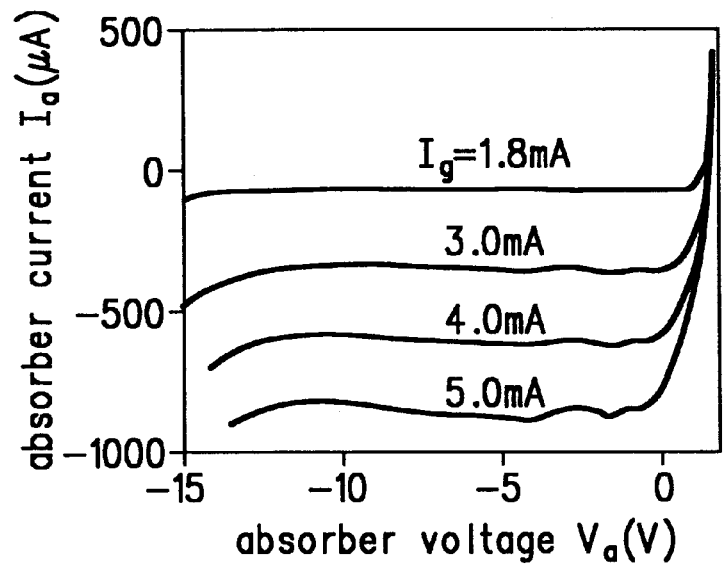
FIGS. 36(a)–36(b) illustrate the absorber current versus voltage ($I_a$-$V_a$) traces measured for the device of the invention under different design criteria.
Figure 36B:
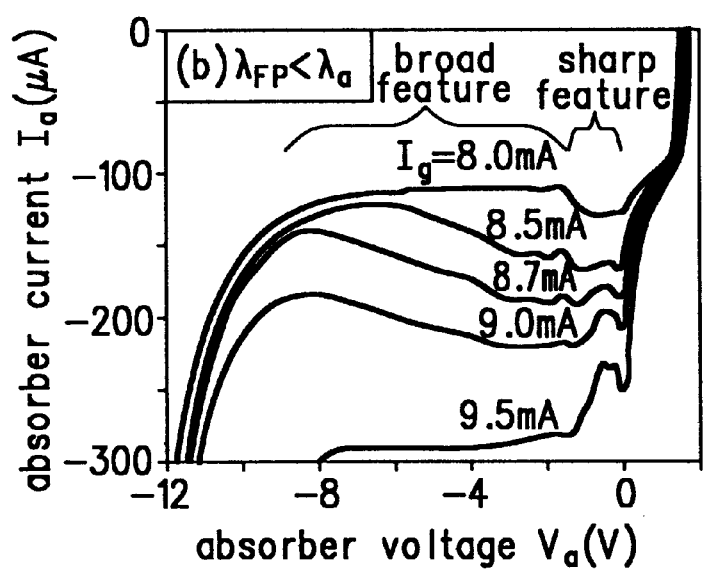
Figure 37:
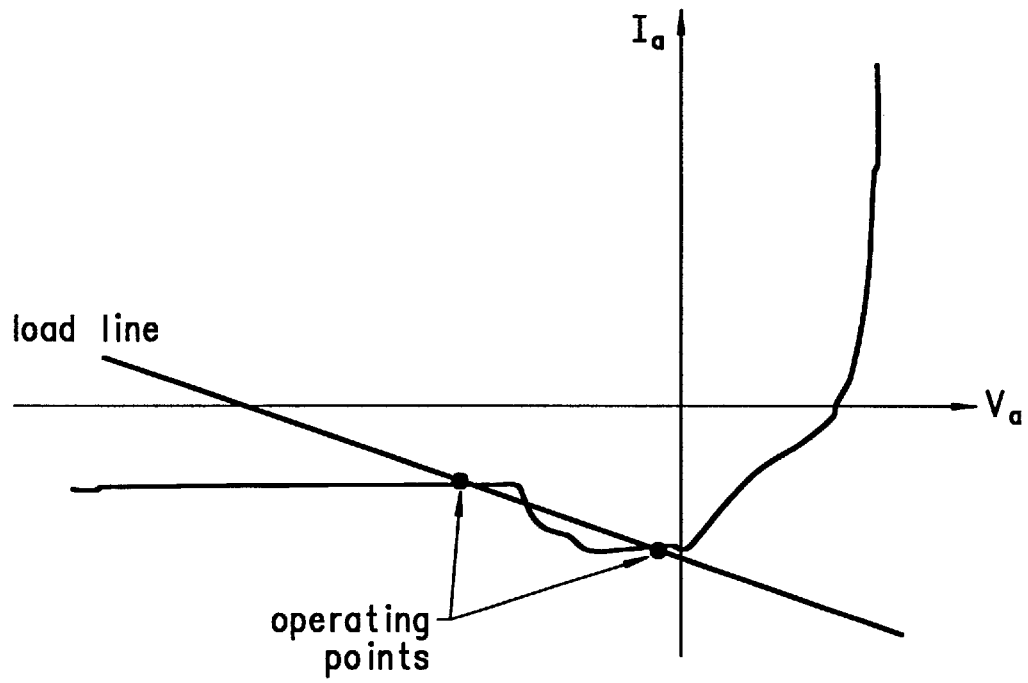
FIG. 37 illustrates the selection of the DC absorber bias (R and $V_o$ in FIG. 20 and $R_1+R_2$ and $V_o$ in FIG. 31) such that the operating load line intersects the absorber current versus voltage ($I_a$-$V_a$) trace three times. This choice of load line yields bistable device operation.

In order to amplify the variation in the absorber current and hence in the read-out signal, the device and biasing circuitry are designed as follows. The device is designed so that the Fabry-Perot wavelength is longer than the absorber band-edge and hence the intracavity absorber exhibits negative differential resistance, as shown in FIG. 36(b). The DC absorber bias circuit is configured so that the operating load line for the device intersects the absorber current versus voltage ($I_a$-$V_a$) trace three times, as shown in FIG. 37. This causes the device to operate in a bistable manner, as shown in FIG. 32. The absorber biases R and $V_o$ are chosen to minimize the width of the hysteresis loop in the L-$I_g$ trace while maximizing the magnitude of the discontinuity in dL/d$I_g$. The DC gain bias current $I_g$ is set to the value at which the variation in the absorber current with and without optical feedback is maximum; this is Point C in FIG. 33. This technique causes a dramatic amplification of the read-out signal.

FIG. 32 shows the desired L-$I_g$ trace, under typical bias conditions of R=20 k$\Omega$ and $V_o$=4 V. As illustrated in the figure, when optical feedback is provided by the external cavity, the L-$I_g$ trace shifts upwards, indicating that optical switching has occurred.

Figure 33:
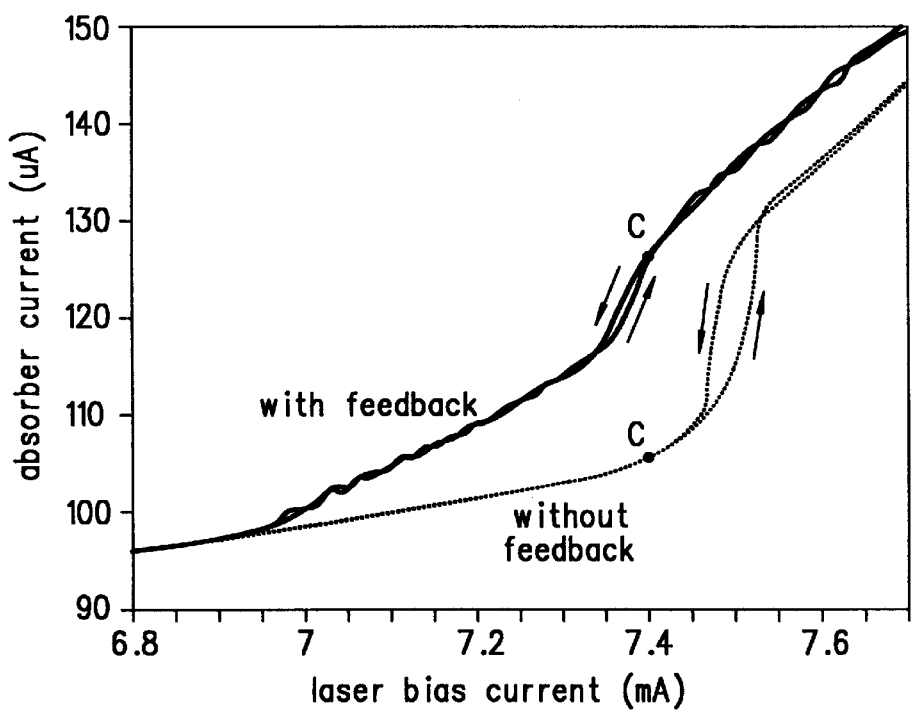
FIG. 33 illustrates that the optical switching of the device of FIG. 31 is accompanied by a switching of the voltage $V_a$ across the integrated absorber.
Figure 34:
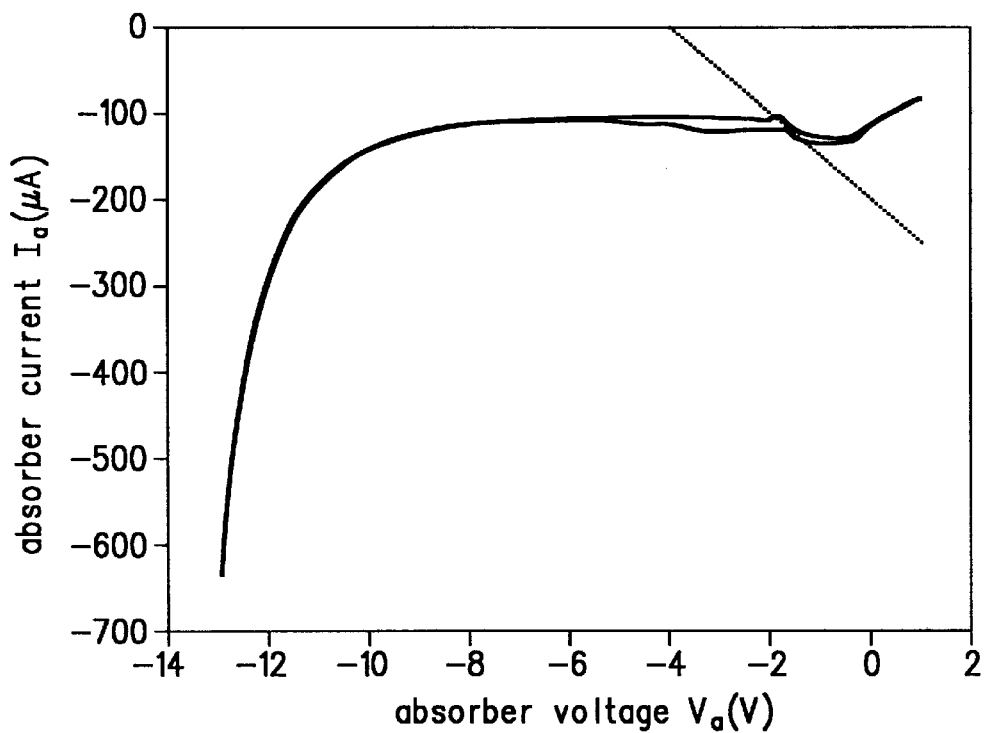
FIG. 34 illustrates absorber $I_a$-$V_a$ traces with and without feedback and the load line corresponding to selected bias conditions.

FIG. 33 shows that the optical switching is accompanied by a switching of the voltage $V_a$ across the integrated absorber. The laser bias current $I_g$ is chosen such that the VCSEL operates at the point C marked in the figure. This operating point maximizes the magnitude of the switching in the absorber voltage. The absorber $I_a$-$V_a$ traces with and without feedback and the load line corresponding to the bias conditions R=20 k$\Omega$ and $V_o$=4V are shown in FIG. 34. From the intersection points of the load line with the $I_a$-$V_{as}$, one can predict an absorber voltage and current swing of 0.5V and 24 $\mu$A, respectively, when optical feedback is applied under these bias conditions. Experimental measurements of this voltage and current swing are virtually identical to the quantities predicted by the load line.

Figure 35:
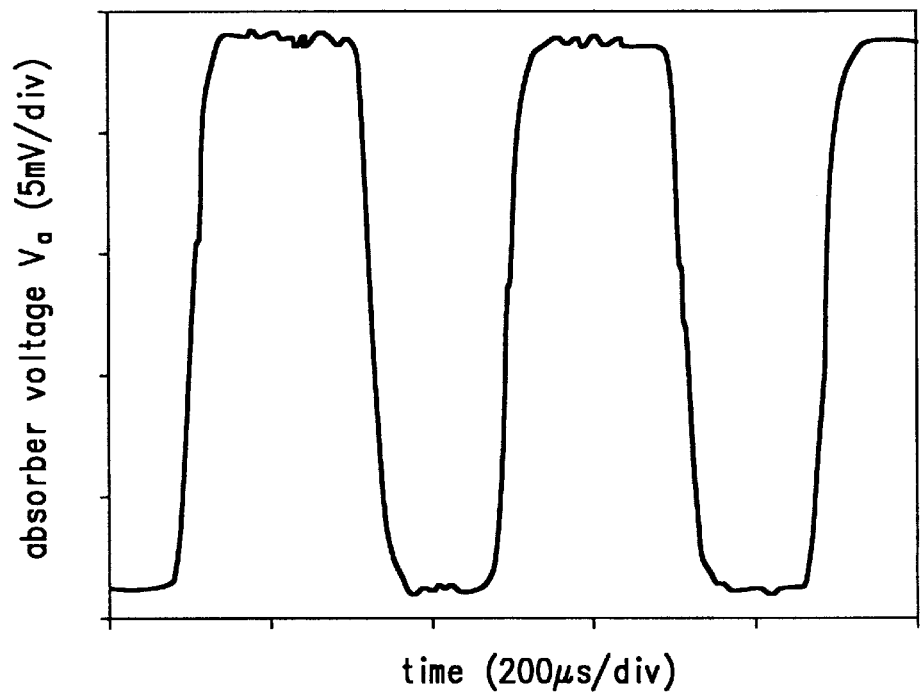
FIG. 35 illustrates the device of the invention operated as an optical disk readout device.

FIG. 35 demonstrates the operation of the device of the invention under bias conditions of R=180 k$\Omega$, $V_o$=9V, and $I_g$=2.5 mA. As the feedback is switched on and off at a rate of 2.5 kHz, the voltage across the absorber varies by 220 mV with very low noise. Thus, the device functions well as a compact, integrated optical disk readout device.

In conclusion, the placement of the Fabry-Perot wavelength ($\lambda_{FP}$) relative to the absorber band-edge ($\lambda_{abs}$) is crucial to the various device manifestations discussed. In order to obtain an integrated detector with accurate power tracking, $\lambda_{FP}$ is set less than $\lambda_{abs}$. With this design, the intracavity absorber behaves like an integrated photodetector, with a linear response to applied optical power, as shown in FIG. 36(a). To establish negative differential resistance (NDR) in the intracavity absorber, $\lambda_{FP}$ is set larger than $\lambda_{abs}$. The response of the absorber with this design is shown in FIG. 36(b). This NDR can be utilized to obtain different device operations depending on how the absorber is biased. If the load line, which is determined by the DC absrober bias (R and Vo; see FIGS. 20 and 31), crosses the absorber current-voltage ($I_a$-$V_a$) characteristic trace three times, as shown in FIGS. 37, bistable operation is established, which can be used for optical pick-up. If the load line is tangential to the absorber $I_a$-$V_a$ trace in the region of NDR, as shown in FIG. 38, then self-pulsation is obtained.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A laser, comprising:
   a first contact to receive an active region control signal;
   a second contact to receive an optical absorber control signal;
   a sandwich of distributed Bragg reflector mirror stacks, each distributed Bragg reflector mirror stack having an alternate doping with respect to an adjacent distributed Bragg reflector mirror stack;
   an active region positioned in said sandwich to provide optical gain in response to said active region control signal; and
   an optical absorber positioned in said sandwich, said optical absorber having wavelength dependent absorption responsive to said optical absorber control signal, thereby selectively producing negative differential resistance in said optical absorber.

2. The laser of claim 1 wherein said negative differential resistance induces self-pulsation.

3. The laser of claim 1 wherein said optical absorber comprises a spacer containing at least one quantum well placed at a peak of the optical field intensity at the Fabry-Perot wavelength of said laser.

4. The laser of claim 1 wherein said optical absorber is positioned in a layer that is at least three-quarters of a wavelength thick.

5. The laser of claim 1 wherein said optical absorber has an absorption edge positioned so that at zero applied bias, the Fabry-Perot wavelength of said laser is longer than the absorption edge wavelength.

6. The laser of claim 1 wherein said optical absorber is controlled by a grounded node and a bias-T circuit node.

7. The laser of claim 6 further comprising a bias-T circuit connected to said bias-T circuit node, said bias-T circuit comprising:
   a first branch with a capacitor in series with a resistor to provide a path for a generated AC signal, and
   a second branch with an inductor in series with a potentiometer and a DC voltage source.

8. The laser of claim 7 wherein said potentiometer and DC voltage source are adjusted so that the load line for the quantum-well modulator junction is tangent to a region of negative differential resistance.

9. The laser of claim 1 wherein said optical absorber is responsive to said optical absorber control signal, which selectively produces bistable operation within said optical absorber, which allows said laser to operate as an optical pick-up device.

10. The laser of claim 9 wherein said optical pick-up device includes a control circuit with a capacitor and an inductor in parallel with said optical absorber.

11. The laser of claim 10 wherein said control circuit includes a first resistive load and a DC voltage source in series with said inductor.

12. The laser of claim 11 wherein said control circuit includes a second resistive load in series with said optical absorber.

13. A laser, comprising:
   a first contact to receive an active region control signal;
   a second contact to receive an optical absorber control signal;
   a sandwich of distributed Bragg reflector mirror stacks, each distributed Bragg reflector mirror stack having an alternate doping with respect to an adjacent distributed Bragg reflector mirror stack;
   an active region positioned in said sandwich to provide optical gain in response to said active region control signal; and
   an optical absorber positioned in said sandwich, said optical absorber producing an optical absorber band edge ($\lambda_{abs}$) that is less than the Fabry-Perot wavelength ($\lambda_{FP}$) to produce negative differential resistance in said optical absorber.

14. The laser of claim 13 wherein said optical absorber is responsive to said optical absorber control signal, which produces bistable operation of said optical absorber to facilitate optical pick-up.

15. The laser of claim 14 further comprising a control circuit with a capacitor and an inductor in parallel with said optical absorber.

16. The laser of claim 15 wherein said control circuit includes a first resistive load and a DC voltage source in series with said inductor.

17. The laser of claim 16 wherein said control circuit includes a second resistive load in series with said optical absorber.

18. The laser of claim 13 wherein said optical absorber is responsive to said optical absorber control signal, which produces self-pulsation of said optical absorber.

19. The laser of claim 18 wherein said optical absorber is controlled by a grounded node and a bias-T circuit node.

20. The laser of claim 19 further comprising a bias-T circuit connected to said bias-T circuit node, said bias-T circuit comprising:
   a first branch with a capacitor in series with a resistor to provide a path for a generated AC signal; and
   a second branch with an inductor in series with a potentiometer and a DC voltage source.

* * * * *